US011422614B2

(12) United States Patent
Katayama et al.

(10) Patent No.: US 11,422,614 B2
(45) Date of Patent: Aug. 23, 2022

(54) SEMICONDUCTOR DEVICE AND CONTROL METHOD OF SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yasuhiro Katayama, Fujisawa Kanagawa (JP); Daisuke Katori, Kawasaki Kanagawa (JP); Tatsuo Inoue, Tokyo (JP); Michitomo Yamaguchi, Kawasaki Kanagawa (JP); Naoki Oshima, Yokohama Kanagawa (JP); Shogo Masuda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 297 days.

(21) Appl. No.: 16/801,215

(22) Filed: Feb. 26, 2020

(65) Prior Publication Data
US 2021/0089110 A1    Mar. 25, 2021

(30) Foreign Application Priority Data
Sep. 24, 2019   (JP) .............................. JP2019-173314

(51) Int. Cl.
G06F 1/3234    (2019.01)
G06F 1/3296    (2019.01)
G01R 31/3177   (2006.01)

(52) U.S. Cl.
CPC ....... *G06F 1/3275* (2013.01); *G01R 31/3177* (2013.01); *G06F 1/3296* (2013.01)

(58) Field of Classification Search
CPC .... G06F 1/3275; G06F 1/3296; G06F 1/3237; G06F 1/3225; G01R 31/3177;
(Continued)

(56) References Cited

U.S. PATENT DOCUMENTS 6,771,118 B2    8/2004 Bittlestone et al.
7,058,834 B2*   6/2006 Woods ...................... G06F 1/32
                                                    713/324
(Continued)

FOREIGN PATENT DOCUMENTS

JP    2005086215 A    3/2005
JP    2005210009 A    8/2005
(Continued)

OTHER PUBLICATIONS

Abdollahi, et al., "Leakage Current Reduction in CMOS VLSI Circuits by Input Vector Control", IEEE Transactions an Very Large Scale Integration (VLSI) Systems, Feb. 2004, Vo. 12, No. 2.

*Primary Examiner* — Thien Nguyen
(74) *Attorney, Agent, or Firm* — Holtz, Holtz & Volek PC

(57) ABSTRACT

A semiconductor device comprises a central processing device, a first logical circuit, and a serial memory interface circuit. The first logical circuit has a first scan chain in which a first scan pattern is set, is configured to suppress a leakage current when the first scan pattern for power saving is set in the first scan chain. The serial memory interface circuit is configured to acquire the first scan pattern for power saving from an external storage device. The leakage current of the first logical circuit is suppressed by transferring the first scan pattern for power saving acquired by the serial memory interface circuit to the first logical circuit and setting the first scan pattern for power saving in the first scan chain under control of the central processing device.

14 Claims, 19 Drawing Sheets

(58) Field of Classification Search
CPC .... G01R 31/318371; G01R 31/318575; Y02D 10/00; Y02D 30/50
See application file for complete search history.

(56) References Cited

U.S. PATENT DOCUMENTS

| | | |
|---|---|---|
| 7,571,402 B2 | 8/2009 | Hossain |
| 7,757,137 B2 | 7/2010 | Ortiz et al. |
| 7,954,023 B2 | 5/2011 | Otsuga et al. |
| 8,299,802 B2 | 10/2012 | Wong et al. |
| 9,058,126 B2 | 6/2015 | Bartling et al. |
| 2005/0050416 A1* | 3/2005 | Hossain ......... G01R 31/318575 714/726 |
| 2009/0193307 A1* | 7/2009 | Hossain ......... G01R 31/318577 714/731 |
| 2013/0139013 A1* | 5/2013 | Jain ................ G01R 31/318555 714/E11.155 |

FOREIGN PATENT DOCUMENTS

| | | |
|---|---|---|
| JP | 2006220433 A | 8/2006 |
| JP | 4954862 B2 | 3/2012 |
| JP | 2012507717 A | 3/2012 |
| JP | 2015534675 A | 12/2015 |
| JP | 2015537400 A | 12/2015 |

\* cited by examiner

| A | B | Z | LEAKAGE CURRENT | NOTE |
|---|---|---|---|---|
| 0 | 0 | 1 | (VDD/r)*(1/2) | WHEN POWER-SUPPLY VOLTAGE IS VDD, ON RESISTANCE OF TRANSISTOR IS 0, AND OFF RESISTANCE THEREOF IS r |
| 0 | 1 | 1 | (VDD/r)*1 | |
| 1 | 0 | 1 | (VDD/r)*1 | |
| 1 | 1 | 0 | (VDD/r)*2 | |

FIG. 4

| A | B | C | Z | LEAKAGE CURRENT | NOTE |
|---|---|---|---|---|---|
| 0 | 0 | 0 | 1 | $(VDD/r)*(1/3)$ | WHEN POWER-SUPPLY VOLTAGE IS VDD, ON RESISTANCE OF TRANSISTOR IS 0, AND OFF RESISTANCE THEREOF IS r |
| 0 | 0 | 1 | 1 | $(VDD/r)*(1/2)$ | |
| 0 | 1 | 0 | 1 | $(VDD/r)*(1/2)$ | |
| 0 | 1 | 1 | 1 | $(VDD/r)*1$ | |
| 1 | 0 | 0 | 1 | $(VDD/r)*(1/2)$ | |
| 1 | 0 | 1 | 1 | $(VDD/r)*1$ | |
| 1 | 1 | 0 | 1 | $(VDD/r)*1$ | |
| 1 | 1 | 1 | 0 | $(VDD/r)*3$ | |

FIG. 6

SEMICONDUCTOR DEVICE AND CONTROL METHOD OF SEMICONDUCTOR DEVICE

CROSS-REFERENCE TO RELATED APPLICATIONS

This application is based upon and claims the benefit of priority from Japanese Patent Application No. 2019-173314, filed on Sep. 24, 2019; the entire contents of which are incorporated herein by reference.

FIELD

Embodiments of the present invention relate to a semiconductor device and a control method of a semiconductor device.

BACKGROUND

In a semiconductor device including a plurality of functional blocks, all the functional blocks are not always used at the same time and there are some unused functional blocks. There is known a method of reducing power consumption in the entire semiconductor device by reducing power consumption in a period in which these functional blocks are not used.

As a method of reducing power consumption in each of such functional blocks, there is known input vector control (IVC) for suppressing a leakage current in the functional blocks. Generally, input vector control requires a dedicated control circuit and therefore has a disadvantage of increase in the circuit scale of the semiconductor device.

BRIEF DESCRIPTION OF THE DRAWINGS

FIG. 4 is a table that represents a relation between a truth table of a NAND gate and a leakage current according to the first embodiment;

FIG. 6 is a table that represents a relation between a truth table of a three-input NAND gate and a leakage current according to the first embodiment;

DETAILED DESCRIPTION

Figure 1:
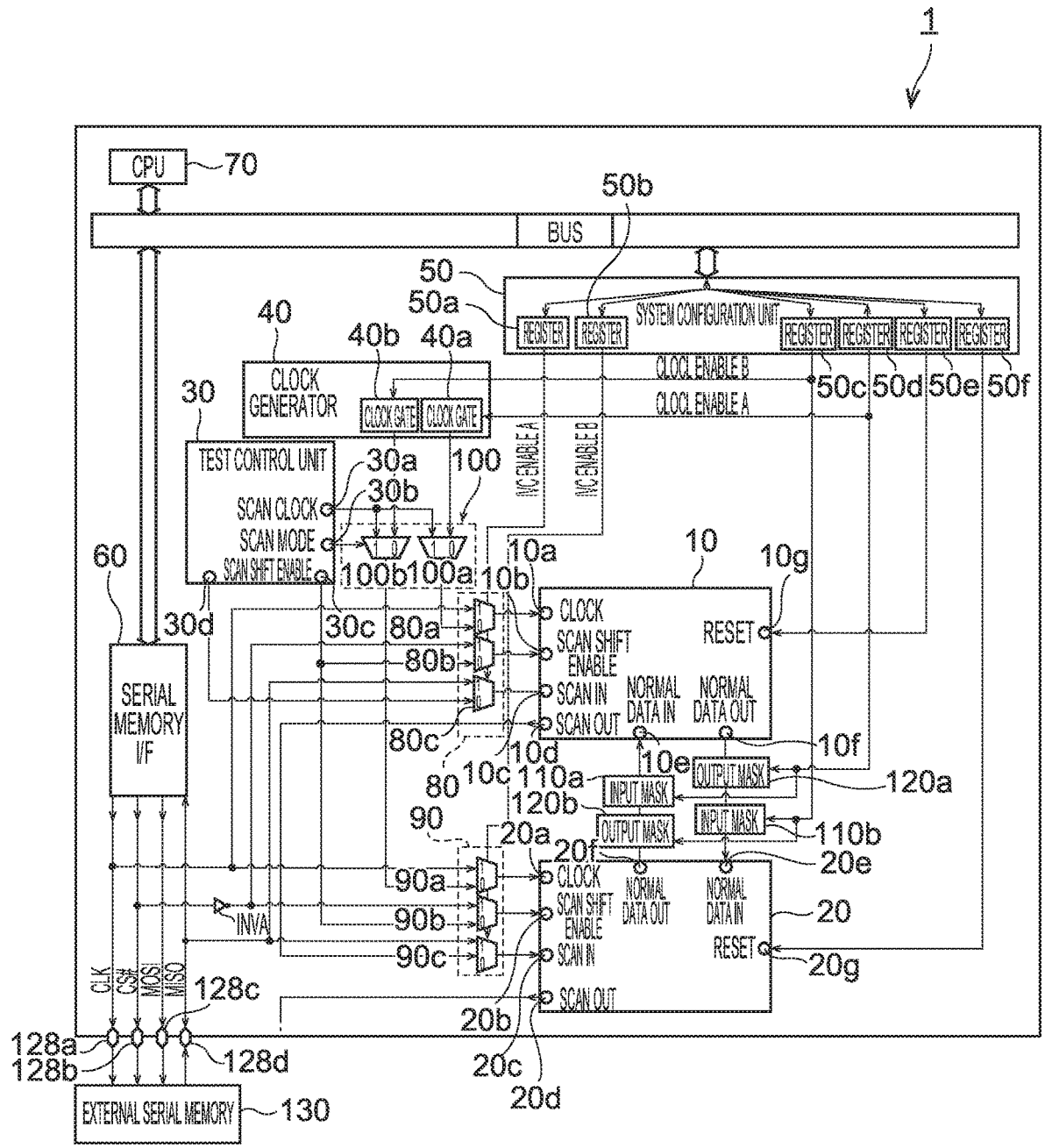
FIG. 1 is a block diagram illustrating a configuration of a semiconductor device according to a first embodiment.

A semiconductor device comprises a central processing device, a first logical circuit, and a serial memory interface circuit. The first logical circuit has a first scan chain in which a first scan pattern is set, is configured to suppress a leakage current when the first scan pattern for power saving is set in the first scan chain. The serial memory interface circuit is configured to acquire the first scan pattern for power saving from an external storage device. The leakage current of the first logical circuit is suppressed by transferring the first scan pattern for power saving acquired by the serial memory interface circuit to the first logical circuit and setting the first scan pattern for power saving in the first scan chain under control of the central processing device.

The semiconductor device and a control method of a semiconductor device according to embodiments of the present invention will now be explained in detail with reference to the accompanying drawings. The embodiments described below are only examples of the embodiments of the present invention and the present invention is not to be construed as being limited to the embodiments. In the drawings referred in the embodiments, like parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment (1) Configuration

A configuration of a semiconductor device 1 according to a first embodiment is described below.

FIG. 1 is a block diagram illustrating the configuration of the semiconductor device 1 according to the present embodiment. The semiconductor device 1 is a device in which a leakage current of a logical circuit can be suppressed, and includes a first logical circuit 10, a second logical circuit 20, a test control circuit 30, a clock generation circuit 40, a system configuration circuit 50, a serial memory interface circuit 60, a central processing device 70, a first switch circuit 80, a second switch circuit 90, a third switch circuit 100, input mask circuits 110a and 110b, output mask circuits 120a and 120b, a storage device 130, and a bus BUS. The semiconductor device 1 is an integrated circuit device that is integrated on an integrated circuit and includes a plurality of functional blocks that function as a system together (SoC: System-on-a-Chip).

The first switch circuit 80 includes selection circuits 80a to 80c, the second switch circuit 90 includes selection circuits 90a to 90c, and the third switch circuit 100 includes selection circuits 100a and 100b. The selection circuits 80a to 80c, 90a to 90c, and 100a and 100b are each a circuit that selects and outputs one of a plurality of input signals. Further, terminals 128a to 128d and an inverter Inva are illustrated in FIG. 1.

The first logical circuit 10 is a logical circuit including a functional block A, has a scan chain (details of the scan chain will be described later), and allows a leakage current to be suppressed in a case where a scan pattern for power saving is set in the scan chain. The first logical circuit 10 includes a clock (Clock) terminal 10a, a scan-shift enable (Scan Shift Enable) terminal 10b, a scan-in (Scan In) terminal 10c, a scan-out (Scan Out) terminal 10d, a normal-data-in (Normal Data In) terminal 10e, a normal-data-out (Normal Data Out) terminal 10f, and a reset (Reset) terminal 10g.

The clock terminal 10a, the scan-shift enable terminal 10b, and the scan-in terminal 10c are connected to the selection circuit 80a to 80c, respectively, and the scan-out terminal 10d is connected to the selection circuit 90c. The normal-data-in terminal 10e is connected to the input mask circuit 110a, and the normal-data-out terminal 10f is connected to the output mask circuit 120a.

When a clock signal is input to the clock terminal 10a, the first logical circuit 10 performs processing in accordance with the clock signal. When an on-signal, that is, a signal having a value 1 is input to the scan-shift enable terminal 10b, the scan chain is configured in the first logical circuit 10.

Here, the scan chain is described in detail. The scan chain is a path for direct control and monitoring of scan flip-flops in the first logical circuit 10 from the scan-in terminal 10c and the scan-out terminal 10d. In order to cause the scan chain to operate in sequence to allow direct control and monitoring of the scan flip-flops from the scan-in terminal 10c and the scan-out terminal 10d is described as "to configure the scan chain".

When scan data is input to the scan-in terminal 10c in sequence, the scan data is set in the scan chain in sequence. An operation of setting the scan data in the scan chain in sequence is referred to as "scan shift operation". When the scan data is input to the scan chain from the scan-in terminal 10c in sequence, scan out data that is output values of the scan chain is output from the scan-out terminal 10d in sequence.

To the normal-data-in terminal 10e, theoretical values that are input to a combinational logical circuit included in the first logical circuit 10 are input in sequence, and are subjected to arithmetic processing. The normal-data-out terminal 10f outputs a result of arithmetic processing of the logical circuit included in the first logical circuit 10. An operation of controlling and monitoring the logical circuit from the normal-data-in terminal 10e and the normal-data-out terminal 10f is referred to as "parallel operation". Generally, a scan test is conducted by repeating the scan shift operation and the parallel operation. Details of the first logical circuit 10 will be described later (see the descriptions referring to FIG. 2A).

The second logical circuit 20 includes a functional block B, and is a logical circuit identical to the first logical circuit 10. The second logical circuit 20 has a scan chain, and allows a leakage current to be suppressed in a case where a scan pattern for power saving is set in the scan pattern. The second logical circuit 20 includes a clock (Clock) terminal 20a, a scan-shift enable (Scan Shift Enable) terminal 20b, a scan-in (Scan In) terminal 20c, a scan-out (Scan Out) terminal 20d, a normal-data-in (Normal Data In) terminal 20e, a normal-data-out (Normal Data Out) terminal 20f, and a reset (Reset) terminal 20g.

The clock terminal 20a, the scan-shift enable terminal 20b, and the scan-in terminal 20c are connected to the selection circuits 90a to 90c, respectively, and the scan-out terminal 20d is connected to another logical circuit. The normal-data-in terminal 20e is connected to the input mask circuit 110b, and the normal-data-out terminal 20f is connected to the output mask circuit 120b.

The clock signal is input to the clock terminal 20a. The second logical circuit 20 performs processing in accordance with the clock signal input to the clock terminal 20a. When an on-signal, that is, a signal having a value 1 is input to the scan-shift enable terminal 20b, the scan chain is configured. When scan data is input to the scan-in terminal 20c, the scan data is set in the scan chain. Scan out data that is output values of the scan chain is output from the scan-out terminal 20d.

To the normal-data-in terminal 20e, theoretical values that are input to a combinational logical circuit included in the second logical circuit 20 are input in sequence, and are subjected to arithmetic processing. The scan out terminal 20d outputs a result of arithmetic processing of the combinational logical circuit included in the second logical circuit 20. Details of the second logical circuit 20 will be described later (see the descriptions referring to FIG. 2B).

Operations of the semiconductor device 1 are classified into a normal mode, a test mode, and a power-saving mode. The normal mode is a mode in which each of the first logical circuit 10 and the second logical circuit 20 performs a normal arithmetic operation. The test mode is a mode in which a scan pattern for scan test is set in a scan chain in at least one of the first logical circuit 10 and the second logical circuit 20. The power-saving mode is a mode in which a scan pattern for power saving is set in the scan chain in at least one of the first logical circuit 10 and the second logical circuit 20. A logical circuit in which no scan pattern is set performs a normal arithmetic operation. Details of the above three modes will be described later (see (2) Operations).

The test control circuit 30 sets the scan pattern for scan test in the scan chain in each of the first logical circuit 10 and the second logical circuit 20, and conducts a scan test on each of the first logical circuit 10 and the second logical circuit 20. This test control circuit 30 includes a scan clock (Scan Clock) terminal 30a, a scan mode (Scan mode) terminal 30b, a scan-shift enable (Scan Shift Enable) terminal 30c, and a scan pattern terminal 30d for scan test.

The scan clock terminal 30a is connected to the selection circuits 100a and 100b, the scan mode terminal 30b is connected to control terminals of the selection circuits 100a and 100b, the scan-shift enable terminal 30c is connected to the selection circuits 80b and 90b, and the scan pattern terminal 30d for scan test and the scan-out terminal 10d are respectively connected to the selection circuits 80c and 90c.

In the present embodiment, a method of generating the scan pattern for scan test, output from the scan pattern terminal 30d of the test control circuit 30 used for conducting the scan test, is not limited. Generally, the scan pattern for scan test is supplied directly from a test device outside the semiconductor device 1 in some cases and is supplied from a scan-pattern generation circuit in the semiconductor device 1 in other cases. The method of supplying the scan pattern for scan test output from the scan pattern terminal 30d is not relevant to the disclosure of the present application, and therefore descriptions thereof are omitted. Further, a connection destination of the scan-out terminal 20d of the second logical circuit 20 is not limited in the present embodiment. In the test mode, the scan-out terminal 20d may be connected to an external terminal or a scan-in terminal of another logical circuit in common implementation of a scan test. However, because the connection destination of the scan-out terminal 20d is not relevant to the disclosure of the present application, descriptions thereof are omitted. Details of the scan test will be described later (see (2-2) Test Mode in (2) Operations).

The test control circuit 30 includes a built-in clock, and outputs a scan clock in the scan test via the scan clock terminal 30a.

The test control circuit 30 also outputs a scan mode signal via the scan mode terminal 30b. The scan mode signal has information indicating ON or OFF. The selection circuits 100a and 100b select a clock signal output from the test control circuit 30 when the scan mode signal is ON, and select a clock signal output from the clock generation circuit 40 described later when the scan mode signal is OFF. Although ON is indicated by a value 1 and OFF is indicated by a value 0 in the present embodiment, for example, the indicating manner is not limited thereto. For example, ON may be indicated by a High signal (for example, a high voltage), and OFF may be indicated by a Low signal (for example, a low voltage).

The test control circuit 30 outputs a scan-shift enable signal via the scan-shift enable terminal 30c. The scan-shift enable terminal 30c is connected to the scan-shift enable terminal 10b of the first logical circuit 10 via the selection circuit 80b. Similarly, the scan-shift enable terminal 30c is connected to the scan-shift enable terminal 20b of the second logical circuit 20 via the selection circuit 90b. The scan-shift enable signal has information indicating ON or OFF. As described above, when the scan-shift enable signal is 1, a scan chain is configured in the logical circuit 10 or 20.

The test control circuit 30 outputs scan patterns A and B for scan test from the scan pattern terminal 30d. The scan pattern terminal 30d is connected to the scan-in terminal 10c of the first logical circuit 10 via the selection circuit 80c. Similarly, the scan pattern terminal 30d is connected to the scan-in terminal 20c of the second logical circuit 20 via the selection circuit 90c. That is, the selection circuits 80c and 90c select an output signal from the scan pattern terminal 30d when IVC enable signals A and B are 0.

The clock generation circuit 40 generates a clock signal. The clock generation circuit 40 includes clock gates (Clock Gate) 40a and 40b. The clock generation circuit 40 outputs the clock signal via the clock gates 40a and 40b. The clock gate 40a is connected to a register 50d and the selection circuit 100a. The clock gate 40a outputs the clock signal when a clock enable signal A is a value 1, and stops the clock signal when the clock enable signal A is a value 0. Similarly, the clock gate 40b is connected to a register 50c and the selection circuit 100b. The clock gate 40b outputs the clock signal when a clock enable signal B is a value 1, and stops the clock signal when the clock enable signal B is a value 0.

The system configuration circuit 50 includes a plurality of registers (register) 50a to 50f. The system configuration circuit 50 operates in accordance with control executed by the central processing device 70.

The IVC enable (IVC enable) signal A is stored in the register 50a. The register 50a is connected to control terminals of the selection circuits 80a to 80c. The IVC enable signal A has information indicating ON (a value 1) or OFF (a value 0).

The selection circuits 80a to 80c select signals of signal lines CLK, CS #, and MISO of the serial memory interface circuit 60 described later, respectively, when the IVC enable signal A is a value 1. Meanwhile, the selection circuits 80a to 80c select signals output from the selection circuit 100a, the scan-shift enable terminal 30c, and the scan pattern terminal 30d, respectively, when the IVC enable signal A is a value 0.

Similarly, the IVC enable (IVC enable) signal B is stored in the register 50b. The register 50b is connected to control terminals of the selection circuits 90a to 90c. The IVC enable signal B has information indicating ON or OFF.

The selection circuits 90a to 90c select the signals of signal lines CLK, CS #, and MISO of the serial memory interface circuit 60 described later, respectively, when the IVC enable signal B is a value 1. Meanwhile, the selection circuits 90a to 90c select signals output from the selection circuit 100b, the scan-shift enable terminal 30c, and the scan-out terminal 10d, respectively, when the IVC enable signal B is a value 0.

The clock enable (Clock Enable) signal B is stored in the register 50c. The register 50c is connected to the clock gate 40b of the clock generation circuit 40, the input mask circuit 110b, and the output mask circuit 120b. The clock enable signal B has information indicating ON or OFF.

Similarly, the clock enable (Clock Enable) signal A is stored in the register 50d. The register 50d is connected to the clock gate 40a of the clock generation circuit 40, the input mask circuit 110a, and the output mask circuit 120a. The clock enable signal A has information indicating ON or OFF.

A reset signal A is stored in the register 50e. The register 50e is connected to the reset terminal 10g of the first logical circuit 10. The reset signal A has information indicating ON or OFF. When the reset signal A in an ON state is input to the first logical circuit 10, the first logical circuit 10 is reset.

Similarly, a reset signal B is stored in the register 50f. The register 50f is connected to the reset terminal 20g of the second logical circuit 20. The reset signal B has information indicating ON or OFF. When the reset signal B in an ON state is input to the second logical circuit 20, the second logical circuit 20 is reset.

The serial memory interface (Serial Memory I/F) circuit 60 is driven in accordance with control executed by the central processing device 70. The serial memory interface (Serial Memory I/F) circuit 60 acquires a scan pattern for power saving, for example, from the storage device 130 in synchronization with a clock. The serial memory interface circuit 60 is, for example, a serial peripheral interface (SPI: Serial Peripheral Interface), and is a clock-synchronized serial interface.

The serial clock (SCLK: Serial Clock) line CLK of the serial memory interface circuit 60 is connected to the first terminal 128*a*, the selection circuit 80*a*, and the selection circuit 90*a*. The sleeve select (SS: Slave Select) line CS # is connected to a second terminal 128*b*. The sleeve select line CS # is also connected to the selection circuit 80*b* and the selection circuit 90*b* via an inversion element.

A master-out-slave-in (MOSI: Master Out Slave In) line MOSI is connected to a third terminal 128*c*. The master-in-slave-out (Master In Slave Out) line MISO is connected to a fourth terminal 128*d*.

The serial memory interface circuit 60 outputs a serial clock signal via the serial clock line CLK. The serial memory interface circuit 60 also outputs a slave select (SS: Slave Select) signal for allowing a master to select a slave that is a communication partner, via the slave select (SS: Slave Select) line CS #. Accordingly, when the slave selection signal is Low (a value 0), the storage device 130 communicates with the serial memory interface circuit 60.

The serial memory interface circuit 60 outputs an instruction signal via the master-out-slave-in line MOSI. The serial memory interface circuit 60 also inputs data from the storage device 130 (the slave) via the master-in-slave-out line MISO.

The central processing device (CPU) 70 is, for example, a CPU (Central Processing Unit), and controls processing parts in the semiconductor device 1.

The input mask circuit 110*a* outputs a predetermined value when the clock enable signal A becomes a value 0. That is, the input mask circuit 110*a* inputs a fixed value to the normal-data-in terminal 10*e* when the clock enable signal A becomes a value 0. In this manner, the input mask circuit 110*a* is used for fixing a value of an input signal to the first logical circuit 10. For example, it is assumed that, when the first logical circuit 10 is set in a power-saving mode (a standby state), the second logical circuit 20 is in operation. In this state, there is conceivable a case where an input signal from the second logical circuit 20 to the first logical circuit 10 is changed. When the input signal is changed, a circuit of a combination of logic gates related thereto is also toggled. Meanwhile, when the value of the input signal is fixed, the toggle is suppressed and consumption of dynamic power is suppressed.

Further, the output mask circuit 120*a* outputs a predetermined value when the clock enable signal A becomes 0. That is, the output mask circuit 120*a* supplies a fixed value to the normal-data-in terminal 20*e* in place of an output from the normal-data-out terminal 10*f*, when the clock enable signal A becomes 0. For example, it is assumed that, when the first logical circuit 10 is set in the power-saving mode (the standby state), the second logical circuit 20 is in operation. In this state, there is conceivable a case where, when a scan pattern for power saving is set in a scan chain in the first logical circuit 10, the output value of the normal-data-out terminal 10*f* becomes a value not appropriate for a normal operation of the second logical circuit 20. By making an input to the normal-data-in terminal 20*e* a fixed value appropriate for the normal operation of the second logical circuit 20, a malfunction of the second logical circuit 20 can be avoided.

Similarly, the input mask circuit 110*b* outputs a predetermined value when the clock enable signal B becomes 0. That is, the input mask circuit 110*b* inputs a fixed value to the normal-data-in terminal 20*e* when the clock enable signal B becomes a value 0.

Similarly, the output mask circuit 120*b* outputs a predetermined value when the clock enable signal B becomes 0.

That is, the output mask circuit 120*b* supplies a fixed value to the normal-data-in terminal 10*e* in place of an output from the normal-data-out terminal 20*f*, when the clock enable signal B becomes 0. Details of the input mask circuits 110*a* and 110*b* and the output mask circuits 120*a* and 120*b* will be described later (see the descriptions referring to FIGS. 7A to 7C).

The storage device (External Serial Memory) 130 is, for example, a clock-synchronized serial interface memory. That is, the storage device 130 is configured by an SPI flash memory (Serial Peripheral Interface Flash Memory), for example. This storage device 130 stores therein a scan pattern for power saving.

Figure 2A:
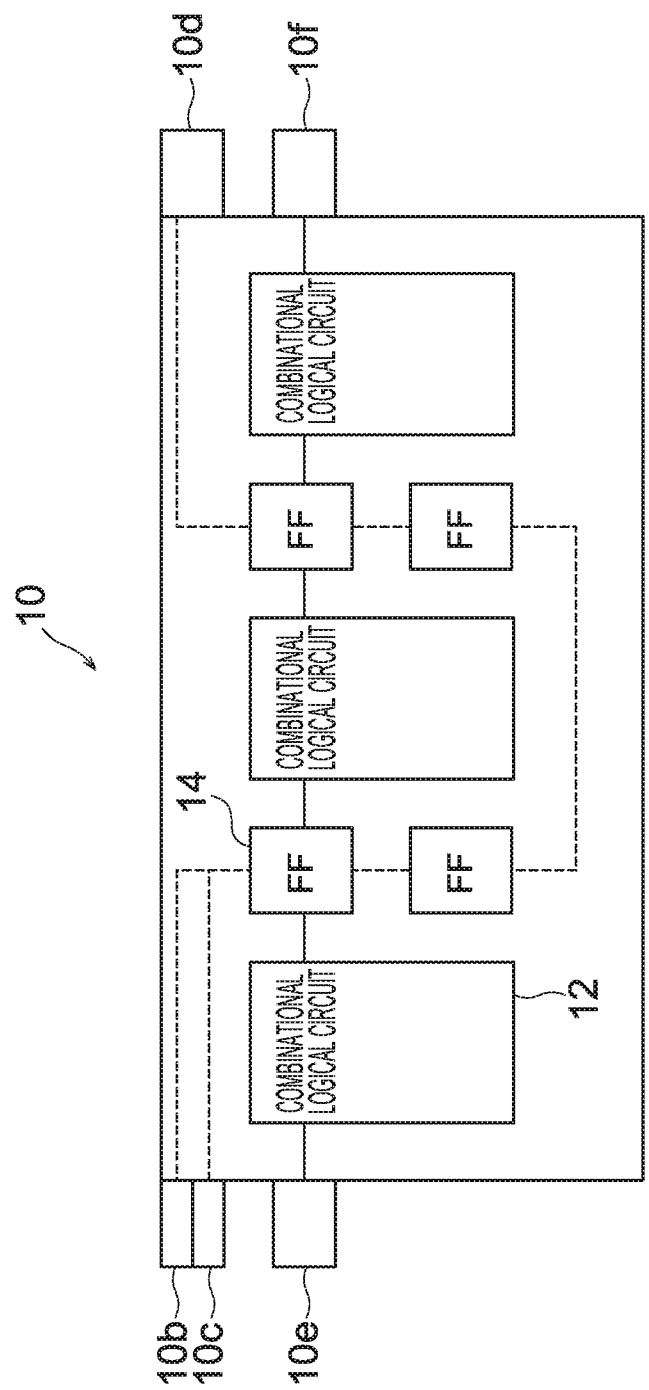
FIG. 2A is a block diagram illustrating a configuration example of a first logical circuit according to the first embodiment.

A configuration example of the first logical circuit 10 is described here with reference to FIG. 2A. FIG. 2A is a block diagram illustrating the configuration example of the first logical circuit 10. Clock wiring is omitted in FIG. 2A for simplifying the description.

The first logical circuit 10 includes a plurality of combinational logical circuits 12 and a plurality of scan flip-flops (FF) 14.

In accordance with control executed by the central processing device 70, the scan flip-flops (FF) 14 are connected in serial connection when 1 is input from the scan-shift enable terminal 10*b*. Accordingly, the scan flip-flops 14 configure a scan chain. Further, when 0 is input from the scan-shift enable terminal 10*b*, the scan flip-flops 14 operate in a normal mode.

Figure 2B:
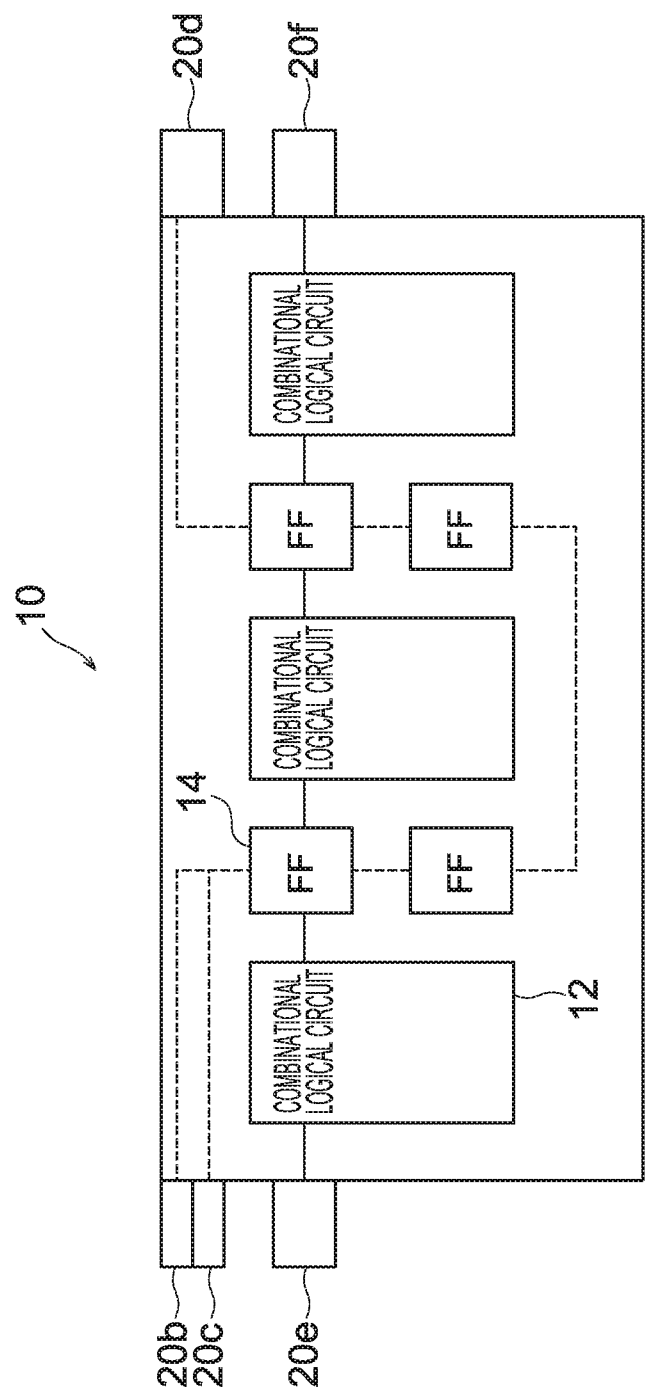
FIG. 2B is a block diagram illustrating a configuration example of a second logical circuit according to the first embodiment.

FIG. 2B is a block diagram illustrating a configuration example of the second logical circuit 20. As described above, the second logical circuit 20 also has an identical configuration to that of the first logical circuit 10. That is, the second logical circuit 20 also includes a plurality of combinational logical circuits 22 and a plurality of scan flip-flops (FF) 24.

Figure 3:
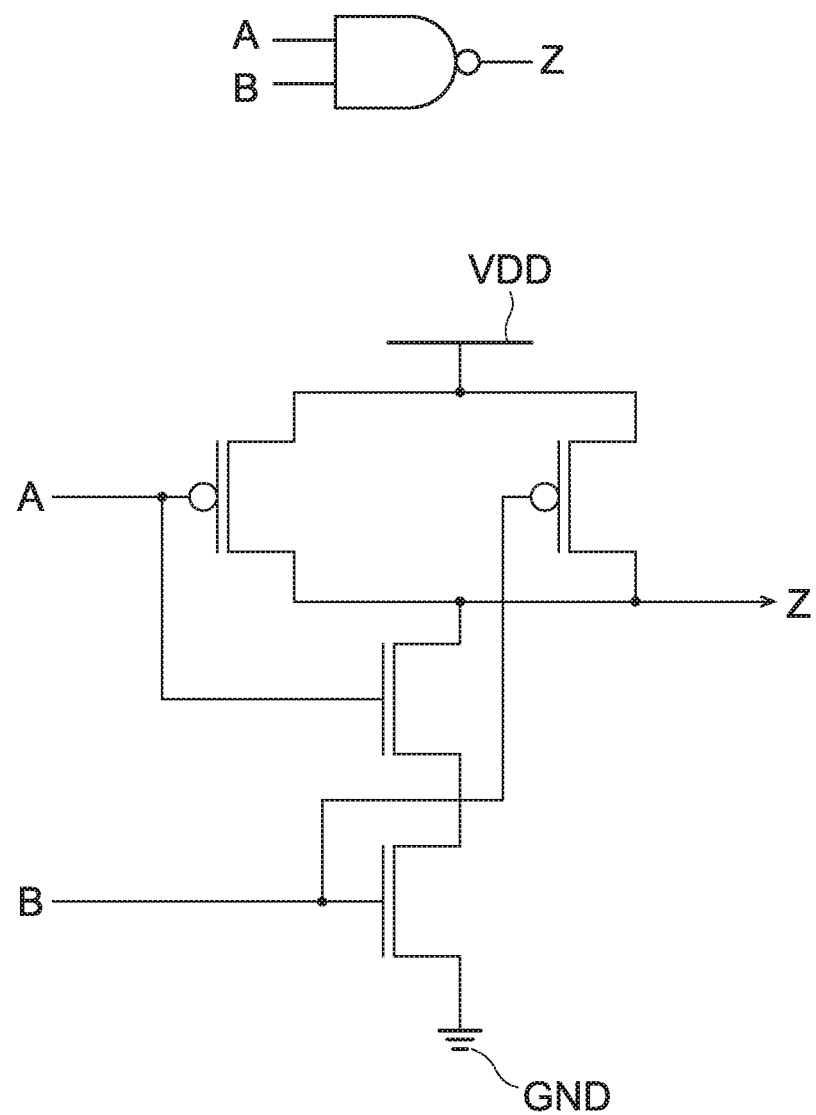
FIG. 3 is a diagram illustrating a circuit configuration example of a two-input NAND gate that configures the first and second logical circuits according to the first embodiment.

Current leakage in a logic gate that configures the first logical circuit 10 and the second logical circuit 20 is described here with reference to FIGS. 3 to 6. FIG. 3 is a diagram illustrating a circuit configuration example of a two-input NAND gate as an example of a logic element that configures the first logical circuit 10 and the second logical circuit 20. The logic element that configures the first logical circuit 10 and the second logical circuit 20 is not limited to this two-input NAND gate. The upper diagram of FIG. 3 illustrates a logic symbol of the NAND gate and the lower diagram illustrates an example of a circuit diagram. Input terminals are labeled with A and B and an output terminal is labeled with Z. The lower diagram illustrates an example in which the NAND gate is configured by a CMOS circuit, for example. It is assumed that an ON resistance of each transistor that configures the CMOS circuit is 0 and an OFF resistance is r.

FIG. 4 is a table that represents a relation between a truth table of a NAND gate and a leakage current. As represented in FIG. 4, four input vectors (0,0), (0,1), (1,0), and (1,1) are input to the input terminals A and B. In a common CMOS circuit, current leakage becomes $[(VDD/r) \times 2]$ for (1,1), which is the largest, and becomes $[(VDD/r) \times (\frac{1}{2})]$ for (0,0), which is the smallest. In this manner, there is a four times difference between (1,1) and (0,0) in a simple model.

Figure 5:
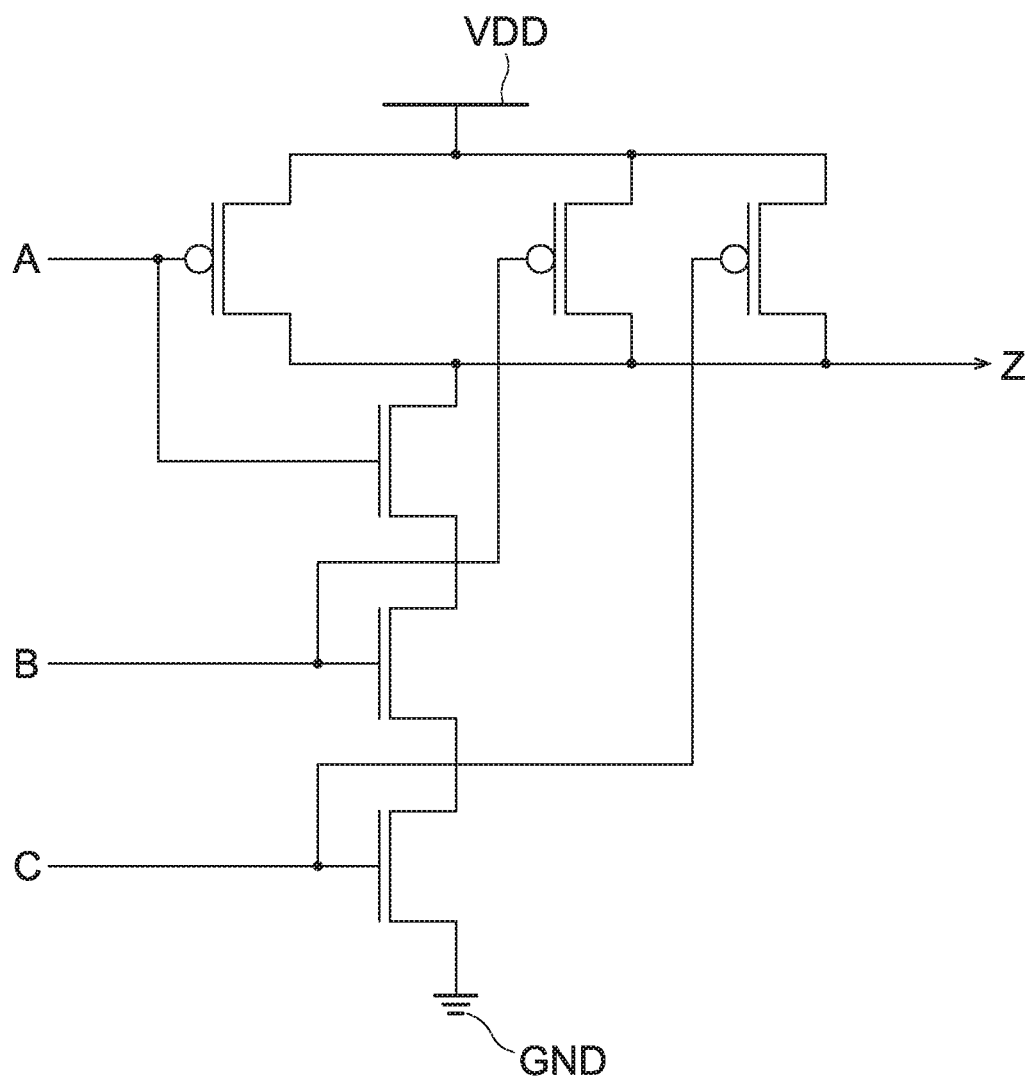
FIG. 5 is a diagram illustrating a circuit configuration example of a three-input NAND gate that configures the first and second logical circuits according to the first embodiment.

FIG. 5 is a diagram illustrating a circuit configuration example of a three-input NAND gate as an example of a logic element that configures the first logical circuit 10 and the second logical circuit 20. The logic element that configures the first logical circuit 10 and the second logical circuit 20 is not limited to this three-input NAND gate. The upper diagram of FIG. 5 illustrates a logic symbol of the NAND gate and the lower diagram illustrates an example of a circuit diagram of the three-input NAND gate. Input terminals are labeled with A, B and C and an output terminal is labeled with Z. The lower diagram illustrates an example in which the NAND gate is configured by a CMOS circuit, for example. It is assumed that an ON resistance of each transistor that configures the CMOS circuit is 0 and an OFF resistance is r.

FIG. 6 is a table that represents a relation between a truth table of a three-input NAND gate and a leakage current. As represented in FIG. 6, eight input vectors (0,0,0), (0,0,1), (0,1,0), (0,1,1), (1,0,0), (1,0,1), (1,1,0), and (1,1,1) are input to the input terminals A, B, and C. In a common CMOS circuit, the leakage becomes the largest for (1,1,1) and becomes the smallest for (0,0,0). In this manner, there is a nine times difference between (1,1,1) and (0,0,0) in a simple model. These NAND gates are simple examples. More logic gates of more types are used in actual logical circuits. A reduction effect of a leakage current in various types of circuits is reported in IEEE TRANSACTIONS ON VERY LARGE SCALE INTEGRATION (VLSI) SYSTEMS, VOL. 12, NO. 2, FEBRUARY 2004, Leakage Current Reduction in CMOS VLSI Circuits by Input Vector Control.

An input vector used for implementing a state having smaller leakage, such as (0,0,1) and (0,1,0), is referred to as "LLV (Low Leakage Vector)", and an input vector for which the leakage becomes the smallest, such as (0,0,0) is referred to as "MLV (Minimum Leakage Vector)".

Figure 7A:
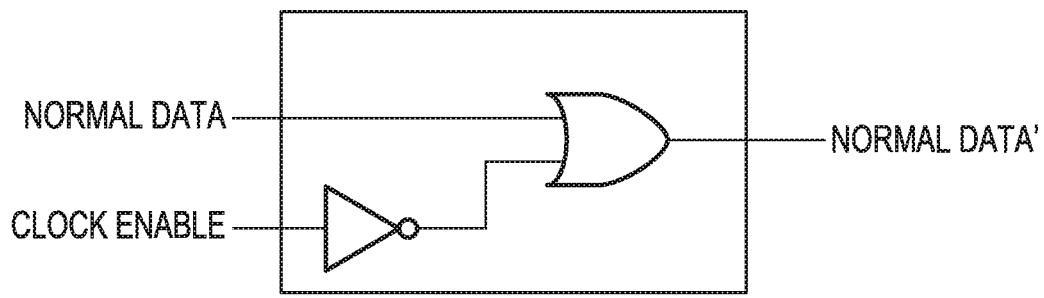
FIG. 7A is a diagram illustrating an example of a circuit configured by an inverter and an OR gate according to the first embodiment.
Figure 7B:
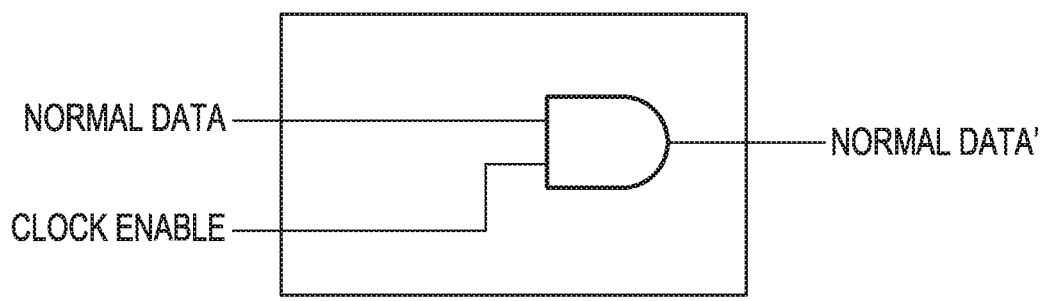
FIG. 7B is a diagram illustrating an example of a circuit configured by an AND gate according to the first embodiment.
Figure 7C:
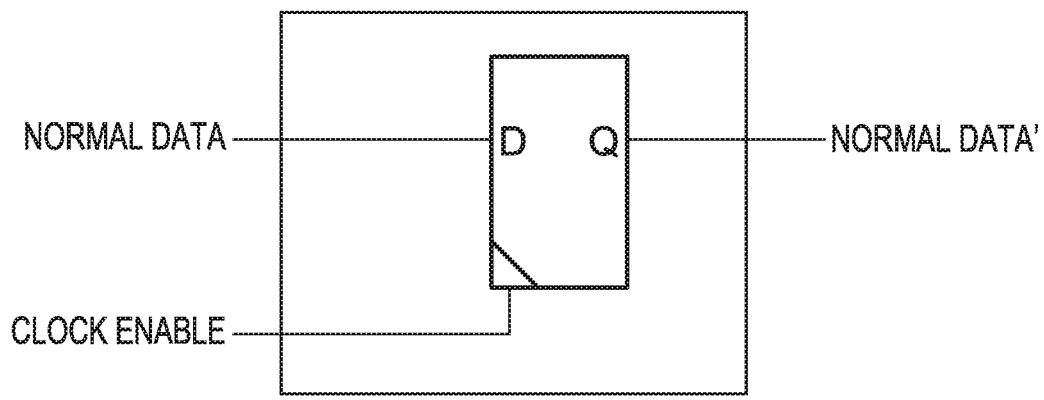
FIG. 7C is a diagram illustrating an example of a circuit configured by a latch circuit according to the first embodiment.

Configuration examples of the input mask circuits 110*a* and 110*b* and the output mask circuits 120*a* and 120*b* are described here with reference to FIGS. 7A to 7C.

FIG. 7A is a diagram illustrating an example of a circuit configured by an inverter and an OR gate. As illustrated in FIG. 7A, in a case where a clock enable (Clock Enable) signal (FIG. 1) is a value 1, when normal data (Normal data) is 1, output normal data (Normal data') is 1. In a case where the clock enable (Clock Enable) signal (FIG. 1) is a value 1, when the normal data (Normal data) is 0, the output normal data (Normal data') is 0.

Meanwhile, in a case where the clock enable (Clock Enable) signal is a value 0, when the normal data (Normal data) is 1, the output normal data (Normal data') is 1. In a case where the clock enable (Clock Enable) signal is a value 0, when the normal data (Normal data) is 0, the output normal data (Normal data') is 1. In this manner, in the configuration example illustrated in FIG. 7A, in a case where the clock enable (Clock Enable) signal (FIG. 1) is a value 0, a mask value can be maintained to be 1.

FIG. 7B is a diagram illustrating an example of a circuit configured by an AND gate. As illustrated in FIG. 7B, in a case where a clock enable (Clock Enable) signal is a value 0, when normal data (Normal data) is 1, output normal data (Normal data') is 0. In a case where the clock enable (Clock Enable) signal is a value 0, when the normal data (Normal data) is 0, the output normal data (Normal data') is 0.

Meanwhile, in a case where the clock enable (Clock Enable) signal is a value 1, when the normal data (Normal data) is 1, the output normal data (Normal data') is 1. In a case where the clock enable (Clock Enable) signal is a value 1, when the normal data (Normal data) is 0, the output normal data (Normal data') is 0. In this manner, in the configuration example illustrated in FIG. 7B, in a case where the clock enable (Clock Enable) signal (FIG. 1) is a value 1, a mask value can be maintained to be 0.

FIG. 7C is a diagram illustrating an example of a circuit configured by a latch circuit. The latch circuit is configured by a half latch, for example, as illustrated in FIG. 7C. For example, while a clock enable signal is 1, a value of a Q terminal is equal to a value of a D terminal. At a transition timing of the clock enable signal from 1 to 0, the latch circuit holds a signal input to the D terminal as an output value. While the clock enable signal is 0, the latch circuit continues to output the held value from the Q terminal. In this manner, in the configuration example illustrated in FIG. 7C, the output value can be maintained to be 0 or 1 in accordance with a value of the signal input to the D terminal.

(2) Operations

Operations of the semiconductor device 1 according to the first embodiment are classified into three modes, which are a normal mode, a test mode, and a power-saving mode. These three modes are described below.

(2-1) Normal Mode

The normal mode is a mode in which both the first logical circuit 10 and the second logical circuit 20 operate as normal functional blocks. In the normal mode, the IVC enable signals A and B output from the system configuration circuit 50 are OFF, and the clock enable signals A and B are ON. That is, values of the IVC enable signals A and B are 0, and value of the clock enable signals A and B are 1. A reset signal is OFF. Further, a scan mode signal and a scan-shift enable signal output from the test control circuit 30 are OFF. That is, values of the scan mode signal and the scan-shift enable signal are 0.

Because the scan mode signal is 0, the selection circuits 100*a* and 100*b* select output signals of the clock gates 40*a* and 40*b*. Because the values of the IVC enable signals A and B are 0, the selection circuits 80*a* to 80*c* and 90*a* to 90*c* select output signals of the selection circuits 100*a* and 100*b*, an output signal of the scan-shift enable terminal 30*c*, an output signal of the scan pattern terminal 30*d*, and the scan-out terminal 10*d*.

Accordingly, a clock generated by the clock generation circuit 40 is output to the clock terminal 10*a* of the first logical circuit 10 and the clock terminal 20*a* of the second logical circuit 20. Because the value of the scan-shift enable signal is 0, the scan flip-flops 14 and 24 (FIGS. 2A and 2B) of the first logical circuit 10 and the second logical circuit 20 do not configure any scan chain.

The input mask circuits 110*a* and 110*b* and the output mask circuits 120*a* and 120*b* each have the circuit configuration in FIG. 7A, for example. That is, because the clock enable signal is a value 1, the input mask circuits 110*a* and 110*b* and the output mask circuits 120*a* and 120*b* output input signal values as output signal values, respectively. In more detail, a signal output from the normal-data-out terminal 10*f* of the first logical circuit 10 is input to the normal-data-in terminal 20*e* of the second logical circuit 20. Similarly, a signal output from the normal-data-out terminal 20*f* of the second logical circuit 20 is input to the normal-data-in terminal 10*e* of the first logical circuit 10. In this manner, in the normal mode, each of the first logical circuit 10 and the second logical circuit 20 performs a normal logical operation in accordance with the clock generated by the clock generation circuit 40.

(2-2) Test Mode

Here, there is described a case where both the first logical circuit 10 and the second logical circuit 20 conduct a scan test.

In a test mode, the IVC enable signals A and B output from the system configuration circuit 50 are OFF. That is, values of the IVC enable signals A and B are 0. Further, the reset signals A and B are OFF. Furthermore, a scan mode signal output from the test control circuit 30 is ON. That is, a value of the scan mode signal is 1.

Because the scan mode signal is 1, the selection circuits 100a and 100b select an output signal of the scan clock terminal 30a. Because the values of the IVC enable signals A and B are 0, the selection circuits 80a, 80b, 90a, and 90b select output signals of the selection circuits 100a and 100b and an output signal of the scan-shift enable terminal 30c. The selection circuit 80c selects an output signal from the scan pattern terminal 30d, and the selection circuit 90c selects the scan-out terminal 10d.

A scan-shift enable signal is controlled by the test control circuit 30. When the scan-shift enable signal is 1, a scan chain is configured in each of the first logical circuit 10 and the second logical circuit 20. When the scan-shift enable signal is 1, a scan pattern for scan test, for example, including logical values {0,1,0,0,1, . . . } is output from the scan pattern terminal 30d of the test control circuit 30. This scan pattern for scan test is input from the scan-in terminal 10c of the first logical circuit 10 in accordance with a clock output from the scan clock terminal 30a, and is set in the scan flip-flops 14 (FIG. 2A). Further, because the scan-out terminal 10d of the first logical circuit is connected to the scan-in terminal 20c of the second logical circuit, the scan pattern for scan test is also set in the scan flip-flops 24 (FIG. 2B) of the second logical circuit 20.

The clock enable signals A and B are 1, and the input mask circuits 110a and 110b and the output mask circuits 120a and 120b output values input thereto, respectively. After the scan pattern for scan test is set in the combinational logical circuits 12 and 22, the scan shift enable signal is changed to 0, and a scan clock is then supplied. Thereafter, the scan clock is stopped, the scan shift enable signal is changed to 1 again, and then a test result is scanned out from the scan-out terminal 20d. Monitoring of the scan out result is then performed. Because there is a difference in scan shift out data between a case where there is any failure in the combinational logical circuits 12 or 22 and a case where there is no failure, it is possible to test for knowing whether there is a failure.

(2-3) Power-Saving Mode

Figure 8:
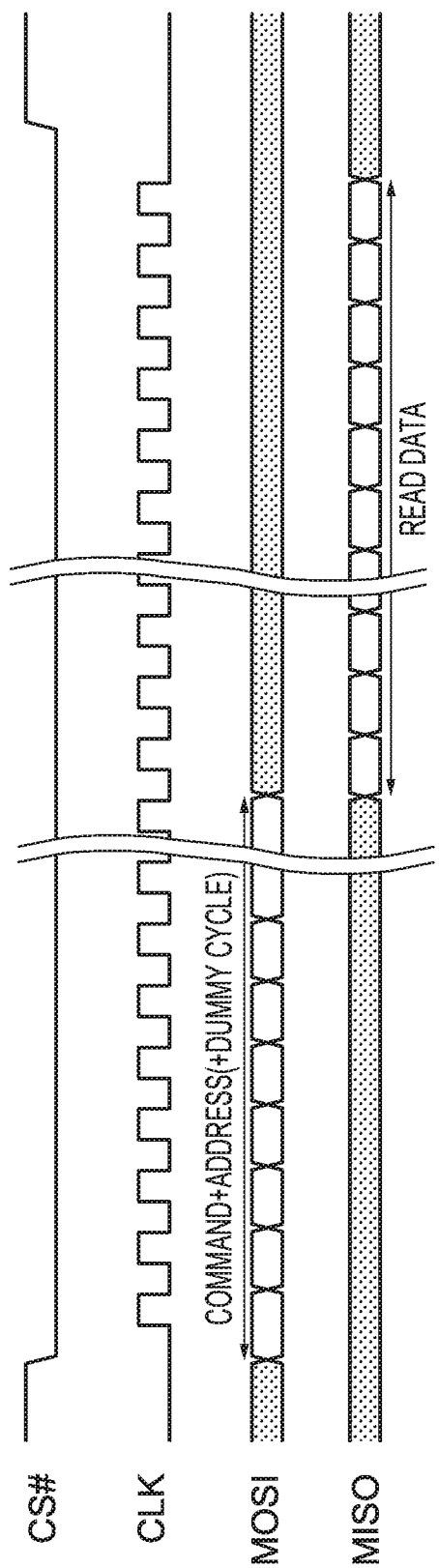
FIG. 8 is a timing chart illustrating a data read operation of a serial memory interface according to the first embodiment.
Figure 9:
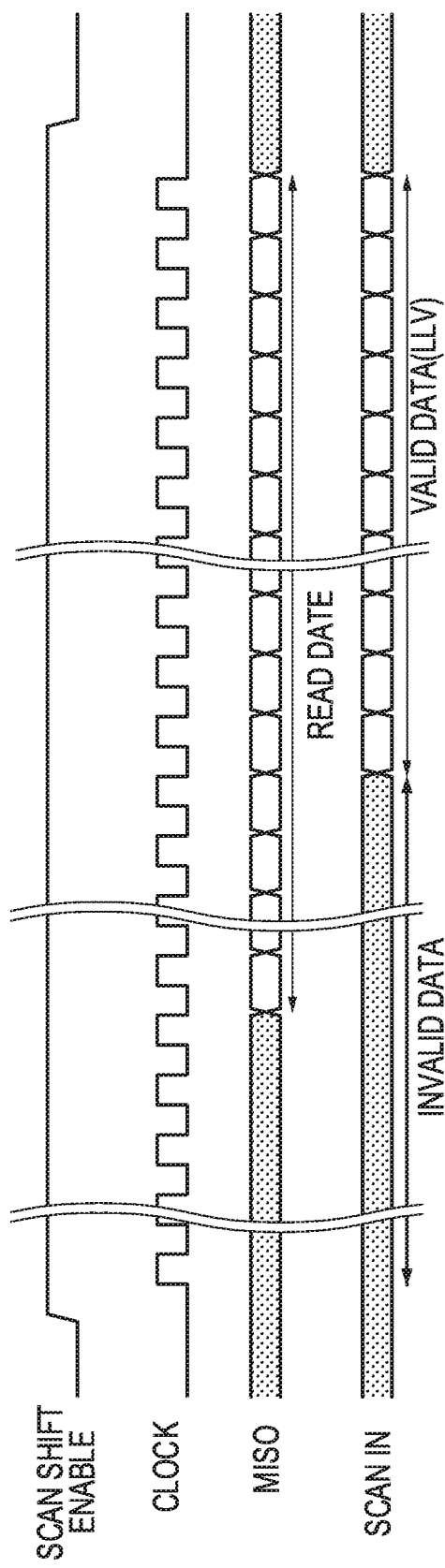
FIG. 9 is a timing chart illustrating a read operation of a scan pattern for power saving according to the first embodiment.

A case where the first logical circuit 10 is changed to a power-saving mode is described here with reference to FIGS. 8 and 9. In this case, the second logical circuit 20 operates in a normal mode. An operation of the second logical circuit 20 in the normal mode is identical to that in (2-1) Normal mode described above, and therefore descriptions thereof are omitted.

In the power-saving mode of the first logical circuit 10, the clock enable signal A is OFF and the clock enable signal B is ON. That is, a value of the clock enable signal A is 0, and a value of the clock enable signal B is 1. The reset signals A and B are OFF.

The scan mode signals A and B and the scan-shift enable signals A and B output from the test control circuit 30 are OFF. That is, values of the scan mode signals A and B and the scan-shift enable signals A and B are 0.

Because the value of the clock enable signal A is 0, the clock gate 40 stops outputting a clock. Because the value of the IVC enable signal A is 1, the selection circuits 80a to 80c select an output signal of the serial clock line CLK, an inverted signal of an output signal of the slave select line CS #, and an input signal of the master-in-slave-out line MISO.

A scan pattern for power saving in the power-saving mode is a pattern that sets a state of inputting an LLV or an MLV to a logic gate configuring the first logical circuit 10. That is, the scan pattern for power saving is a scan pattern that functions as input vector control (IVC) for the first logical circuit 10.

FIG. 8 is a timing chart illustrating timings of signals that flow in respective signal lines when a serial memory interface is caused to perform a read operation in a transition from a normal mode to a power-saving mode. The vertical axis represents, in sequence, a selection signal (CS #) that flows in the slave select line CS #, a clock (CLK) signal that flows in the serial clock line CLK, a master-out-slave-in (MOSI) signal that flows in the master-out-slave-in line MOSI, and a master-in-slave-out (MISO) signal that flows in the master-in-slave-out line MISO. The horizontal axis represents a time.

FIG. 9 is a timing chart illustrating timings of data input from respective signal lines and the scan-in terminal 10c in a transition from a normal mode to a power-saving mode. The vertical axis represents, in sequence, a scan-shift enable signal that flows in the slave select line CS #, a clock (CLK) signal that flows in the serial clock line CLK, a master-in-slave-out (MISO) signal that flows in the master-in-slave-out line MISO, and a scan pattern (Valid data (LLV)) for power-saving mode input from the scan-in terminal 10c. The horizontal axis represents a time.

In the transition from the normal mode to the power-saving mode, the IVC enable signal A is set to be ON (1). As illustrated in FIG. 8, the serial memory interface circuit 60 makes the selection signal (CS #) LOW to make access to the storage device 130 valid in the power-saving mode of the first logical circuit 10. Because the selection signal (CS #) is LOW, inverted 1 is input to the scan shift enable terminal 10b (FIG. 9). Accordingly, a scan chain is configured in the first logical circuit 10. The clock signal CLK in the clock signal line CLK is input to the clock terminal 10a. Because the value of the clock enable signal A is 0, the input mask circuit 110a and the output mask circuit 120a output a fixed value.

Next, the serial memory interface circuit 60 outputs data that instructs a read range of the scan pattern for power-saving mode to the storage device 130, as the master-in-slave-out signal (MISO). Generally, this data is a command and an address (Command+Address), and for some types of devices, a dummy cycle (Dummy cycle) is further required. Accordingly, the serial memory interface circuit 60 reads out the scan pattern for power-saving mode, for example, logical values such as {0,1,0,0,1, . . . } from the storage device 130.

As illustrated in FIG. 9, the scan pattern for power-saving mode (Valid Data (LLV)) read out by the serial memory interface circuit 60 is then input from the scan-in (Scan in) terminal 10c in sequence in accordance with the clock signal CLK in the clock signal line CLK and is set in the scan flip-flops 14 (FIG. 2A). After setting, the IVC enable signal A is set to be OFF (0). When the scan pattern for power saving is set in the scan flip-flips 14 (FIG. 2A) that is a scan chain, a vector that is either an LLV or an MLV is input to a logic gate that forms the first logical circuit 10. Accordingly, each logic gate that configures the first logical circuit 10 is set in a state where the leakage is small or the smallest.

In this manner, when the scan pattern for power saving is set in the scan flip-flops 14 (FIG. 2A), a leakage current in the first logical circuit 10 is suppressed more than in the normal mode, so that power consumption of the semiconductor device 1 can be suppressed.

When the first logical circuit 10 is caused to return from the power-saving mode (a LowPower state) to the normal mode, the reset signal A is input to the reset terminal 10g to initialize the first logical circuit 10.

A time for returning from the power-saving mode (the LowPower state) by input vector control to the normal mode is shorter than that in a case of shutting down a power of the first logical circuit 10 described later. Accordingly, it is possible to return to the normal mode in a short time and to prevent the processing performance from being lowered. Therefore, use of the scan pattern for power saving provides an advantage that it is possible to eliminate the time of waiting for stabilization of power in returning from the power-saving mode to the normal mode.

Generally, the size of data (Read Data) of the storage device 130 that is an external memory, read at one time, is a power of 2. In this case, the length of a scan chain (Scan Chain) configured by the scan flip-flips 14 (FIG. 2A) and the length of the read scan pattern for power-saving mode (Read Data) do not match with each other in some cases. Therefore, by arranging a valid scan pattern for power-saving mode (Valid data (LLV)) in the scan pattern for power-saving mode (Read Data) to be aligned with back, redundant data in a leading portion is not left in the scan chain, and thus it is possible to leave the valid scan pattern for power-saving mode (Valid data (LLV)) only in the scan flip-flops 14 that configure the scan chain. With this configuration, it is possible to set the storage device 130 that is an external memory in the scan chain configured by the scan flip-flops 14 (FIG. 2A) without adding any complicated control circuit.

Power consumed by the semiconductor device 1 includes dynamic power and static power. For example, clock gating may be used as one method for reducing the dynamic power of the first logical circuit 10. By stopping clock supply in a period in which the first logical circuit 10 is not used, it is possible to stop a current for charging/discharging in clock wiring and reduce the power consumption. Power shutdown can be used for reducing static power of the first logical circuit 10. In power shutdown, a power domain in the semiconductor device 1 is isolated in designing the semiconductor device 1, and a power of that domain is shut down when all blocks in that domain in operation are unused. In this manner, it is possible to reduce a leakage current. In order to shut down the power, a method of including a power switch (PSW) in the semiconductor device 1 or a method of mounting a separate power terminal for each domain and controlling the power for each domain by a system outside the semiconductor device 1 may be used. Power shutdown is effective for reduction of a leakage current. However, in returning, it is necessary to wait for stabilization of power after start of power supply and then start an operation. Thus, there is a disadvantage of lowering of the processing performance because of the waiting time.

Figure 10:
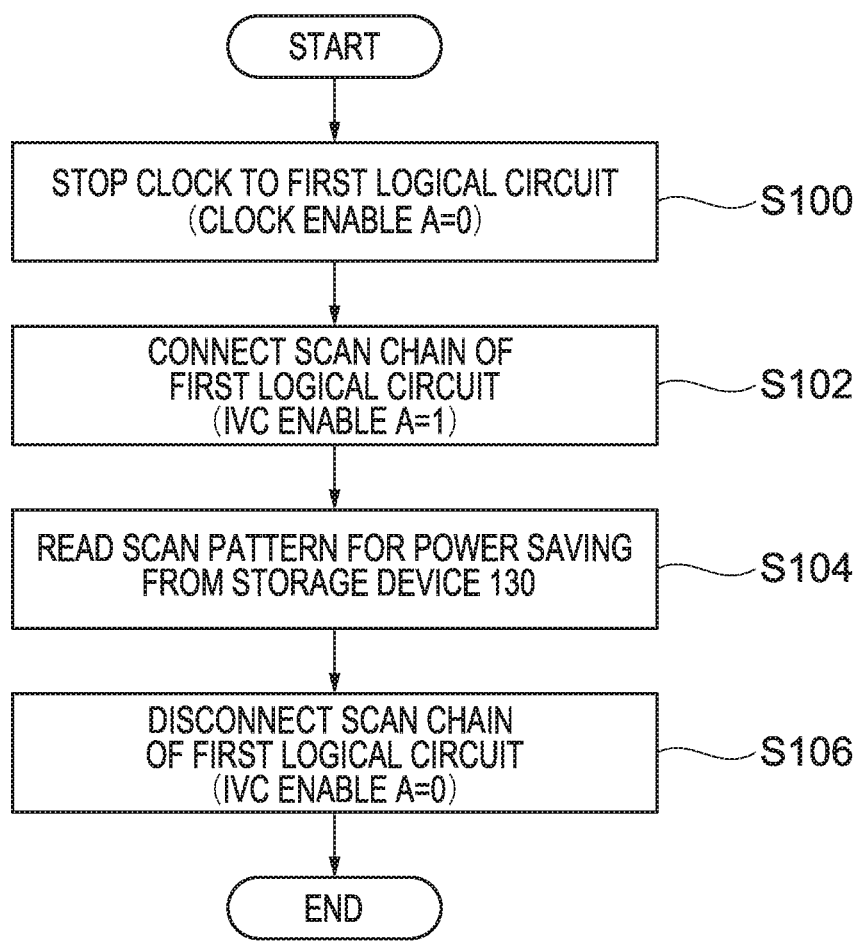
FIG. 10 is a flowchart illustrating an example of control for a transition of the first logical circuit according to the first embodiment from a normal mode to a power-saving mode.

FIG. 10 is a flowchart illustrating an example of control for a transition of the first logical circuit 10 from a normal mode to a power-saving mode.

First, the clock enable signal A is set in an OFF state (a value 0) due to control executed by the central processing device 70 (Step S100). Accordingly, a clock from the clock generation circuit 40 to the first logical circuit 10 is stopped.

Next, the IVC enable signal A is set in an ON state (a value 1) due to control executed by the central processing device 70 (Step S102). Accordingly, the scan flip-flops 14 that is a scan chain in the first logical circuit 10 and the master-in-slave-out line MISO are connected to each other.

Next, the serial memory interface circuit 60 reads out a scan pattern for power saving from the storage device 130 due to control executed by the central processing device 70. Accordingly, the scan pattern for power saving is set in the scan flip-flops 14 in sequence (Step S104). Thus, a leakage current in the first logical circuit 10 is suppressed.

Next, the IVC enable signal A is set in an OFF state (0) due to control executed by the central processing device 70 (Step S106). The scan flip-flops 14 that is the scan chain in the first logical circuit 10 and the master-in-slave-out line MISO are disconnected from each other. In this manner, the scan flip-flops 14 that is the scan chain in the first logical circuit 10 and the master-in-slave-out line MISO are connected to each other, and the scan pattern for power saving is set in the scan flip-flops 14. At an end of the power-saving mode, the scan flip-flops 14 and the master-in-slave-out line MISO are disconnected from each other.

Figure 11:
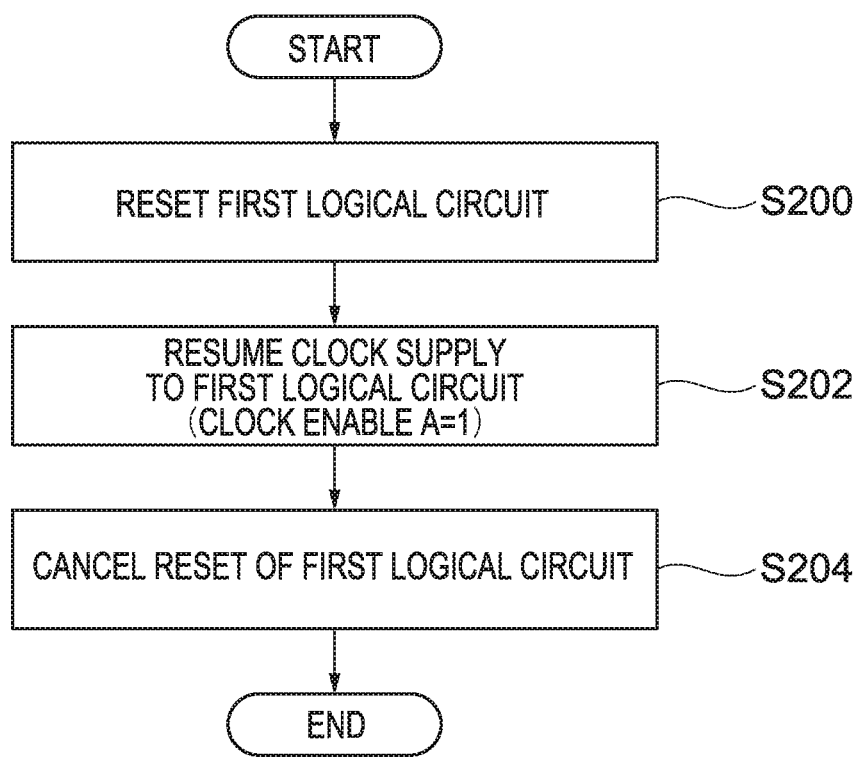
FIG. 11 is a flowchart illustrating an example of control for a transition of the first logical circuit according to the first embodiment from a power-saving mode to a normal mode.

FIG. 11 is a flowchart illustrating an example of control for a transition of the first logical circuit 10 from a power-saving mode to a normal mode.

First, the reset signal A is set in an ON state due to control executed by the central processing device 70 (Step S200). Accordingly, the first logical circuit 10 is set in an initial state.

Next, the clock enable signal A is set in an ON state (1) due to control executed by the central processing device 70 (Step S202). Accordingly, clock supply from the clock generation circuit 40 to the first logical circuit 10 is resumed.

Next, the reset signal A is set in an OFF state due to control executed by the central processing device 70 (Step S204). Accordingly, reset of the first logical circuit 10 is canceled. In this manner, the first logical circuit 10 is reset, clock supply from the clock generation circuit 40 to the first logical circuit 10 is resumed, and the power-saving mode transitions to the normal mode. Because an internal state of the first logical circuit 10 is initialized at this time, it is possible to start a normal arithmetic operation.

Such a method of using input vector control (IVC) controls an output of the scan flip-flops 14 or 24 (FIG. 2A or 2B), which becomes an input of a logical circuit. Therefore, the existing scan-in terminal 10c or 20c for the scan flip-flops 14 or 24 can be used, and it is unnecessary to add any logical circuit. Accordingly, it is possible to suppress increase of logic delay in a normal function.

As described above, according to the present embodiment, the serial memory interface circuit 60 acquires a scan pattern for power saving from the storage device 130, and sets the acquired scan pattern in a scan chain in the first logical circuit 10 or the second logical circuit 20 via the selection circuits 80a to 80c or 90a to 90c due to control executed by the central processing device 70. Accordingly, it is possible to set the scan pattern for power saving stored in the storage device 130 in the scan chain sequentially by an instruction signal from the central processing device 70. Therefore, by changing the instruction signal, it is possible to generally change the scan pattern for power saving or the like.

Further, generally, the serial memory interface circuit 60 is mounted in a semiconductor device. Therefore, it is possible to configure a circuit capable of suppressing current leakage in the first logical circuit 10 or the second logical circuit 20 by adding the corresponding selection circuits 80a to 80c or 90a to 90c, for example. In this manner, it is possible to suppress increase in the circuit scale of the semiconductor device and to reduce power consumption. Furthermore, because the scan pattern for power saving is stored in the storage device 130, it is possible to easily store and change the scan pattern for power saving. Accordingly, it is unnecessary to determine the scan pattern for power saving in a design stage, and therefore the present embodiment can be also applied to a product having a short design time. For example, it is easy to calculate scan patterns for power saving by computer experiment or the like and employ a scan pattern for power saving that can suppress a leakage current more.

Second Embodiment

The semiconductor device 1 according to a second embodiment is different from the semiconductor device 1 according to the first embodiment in that each of input mask circuits and output mask circuits between the normal-data-in terminals 10e and 20e and the normal-data-out terminals 10f and 20f of the first logical circuit 10 and the second logical circuit 20 are integrated as one circuit. Differences between the semiconductor device 1 according to the second embodiment and the semiconductor device 1 according to the first embodiment are described below.

Figure 12:
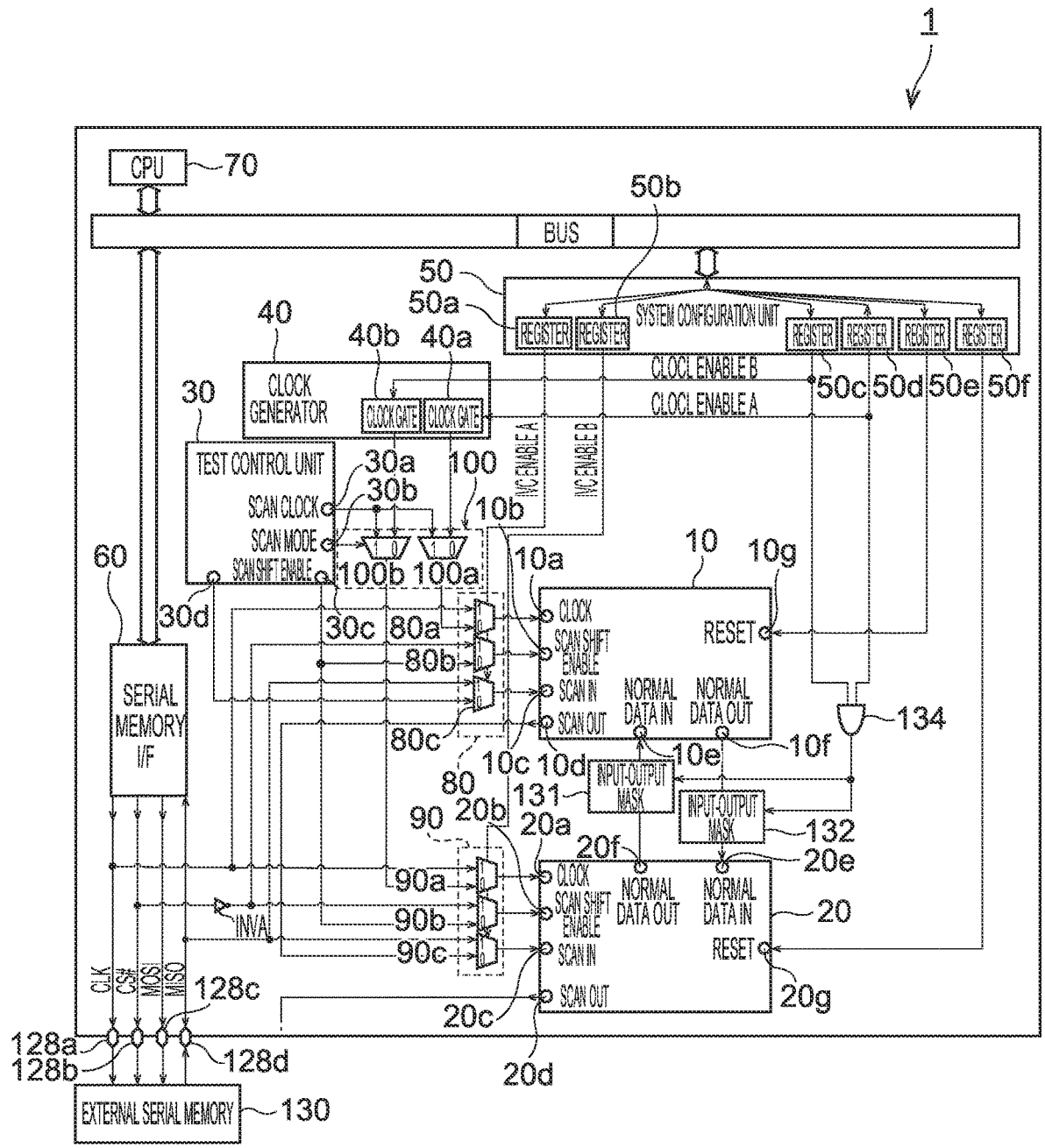
FIG. 12 is a block diagram illustrating a configuration of a semiconductor device according to a second embodiment.

FIG. 12 is a block diagram illustrating a configuration of the semiconductor device 1 according to the second embodiment. As illustrated in FIG. 12, the semiconductor device 1 is different from the semiconductor device 1 according to the first embodiment in including mask circuits 131 and 132 and an AND gate 134. The mask circuit 131 according to the present embodiment corresponds to a first mask circuit, and the mask circuit 132 corresponds to a second mask circuit.

The mask circuit 131 is provided between the normal-data-in terminal 10e of the first logical circuit 10 and the normal-data-out terminal 20f of the second logical circuit 20. The mask circuit 131 can have an identical configuration to that in any of FIGS. 7A to 7C, for example. For example, the mask circuit 131 outputs a fixed value when a value 0 is input from the AND gate 134.

The mask circuit 132 is provided between the normal-data-in terminal 20e of the second logical circuit 20 and the normal-data-out terminal 10f of the first logical circuit 10. The mask circuit 132 also has an identical configuration to that of the mask circuit 131. That is, the mask circuit 132 outputs a fixed value when a value 0 is input from the AND gate 134.

The AND gate 134 outputs a value 0 when at least one of the clock enable signals A and B is in an OFF state (a value 0).

As described above, the semiconductor device 1 according to the present embodiment is provided with the mask circuits 131 and 132 into which a plurality of mask circuits between the normal-data-in terminals 10e and 20e and the normal-data-out terminals 10f and 20f of the first logical circuit 10 and the second logical circuit 20 are integrated with one another. Accordingly, the number of stages of the mask circuits is reduced by one. Therefore, the number of signal logic stages for normal data is reduced, so that it is possible to suppress both the circuit amount and signal propagation delay.

Third Embodiment

The semiconductor device 1 according to a third embodiment is different from the semiconductor device 1 according to the first embodiment in that scan chains in the first logical circuit 10 and the second logical circuit 20 are each configured by a plurality of lines. Differences between the semiconductor device 1 according to the third embodiment and the semiconductor device 1 according to the first embodiment are described below.

Figure 13:
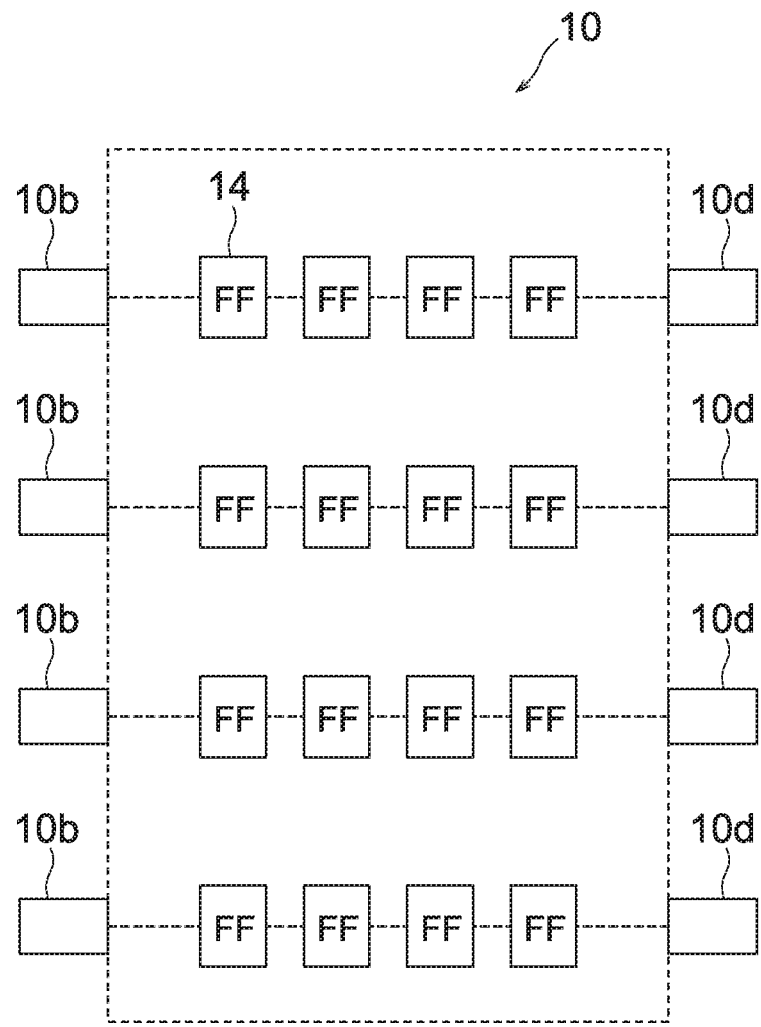
FIG. 13 is a block diagram illustrating an example in which there are four scan chains in a first logical circuit according to a third embodiment.

FIG. 13 is a block diagram illustrating an example in which there are four scan chains in the first logical circuit 10. As illustrated in FIG. 13, the four scan chains configured by the scan flip-flops 14 are configured in parallel to one another. Accordingly, the number of the scan-in terminals 10c and the number of the scan-out terminals 10d are both four. Therefore, a four-line configuration can be applied to the serial memory interface circuit 60. Although the present embodiment is described by way of example where the number of scan chains is four, the number thereof is not limited thereto. For example, the number of the scan chains may be two or eight. The second logical circuit 20 can also have an identical configuration to that of the first logical circuit 10.

The storage device 130 is configured by an SPI flash memory as described above. It is possible to set the length of data (Read data) read at one time from the SPI flash memory to any length required by the central processing device 70 that is a master, as long as it is within the memory capacity. However, the length of data read at one time, which can be performed on the serial memory interface circuit (SPI Flash Controller) 60 side, is limited by the specification of the serial memory interface circuit 60 or another system factor. For example, the length of the read data may depend on the burst length of the bus BUS. Further, the length of the read data may depend on the specification of the bus BUS or the specification of the central processing device 70 that issues it.

Therefore, when the length of data read at one time from the storage device 130 is shorter than the length of a scan chain in the logical circuit 10 or 20, setting of a scan pattern for power-saving mode is not completed by performing a data reading operation once.

Therefore, in the present embodiment, four scan chains are configured such that each of the scan chains has a length equal to or shorter than the length of data read at one time. Accordingly, the scan pattern for power-saving mode is divided and is set in each scan chain.

In this case, by arranging a valid scan pattern for power-saving mode in the scan pattern for power-saving mode to be aligned with back, redundant data in a leading portion is not left in the scan chain, and thus it is possible to set the valid scan pattern for power-saving mode only in each scan chain.

Further, in a case where the scan chain in the logical circuit 10 or 20 is configured by four lines and a serial memory interface has a 4-bit data width, that is, the serial memory interface corresponds to a serial memory device having a 4-bit data width, for example, data for the four scan chains can be read from an external memory at once. In a case of such implementation, the number of shift cycles for setting the scan pattern for power saving is reduced, and it is possible to transition to a low power consumption state earlier.

Fourth Embodiment

The semiconductor device 1 according to a fourth embodiment is different from the semiconductor device 1 according to the first embodiment in that a path for outputting data set in the scan flip-flops 14 or 24 in the logical circuit 10 or 20 to the storage device 130 is added. Differences between the semiconductor device 1 according to the fourth embodiment and the semiconductor device 1 according to the first embodiment are described below.

Figure 14:
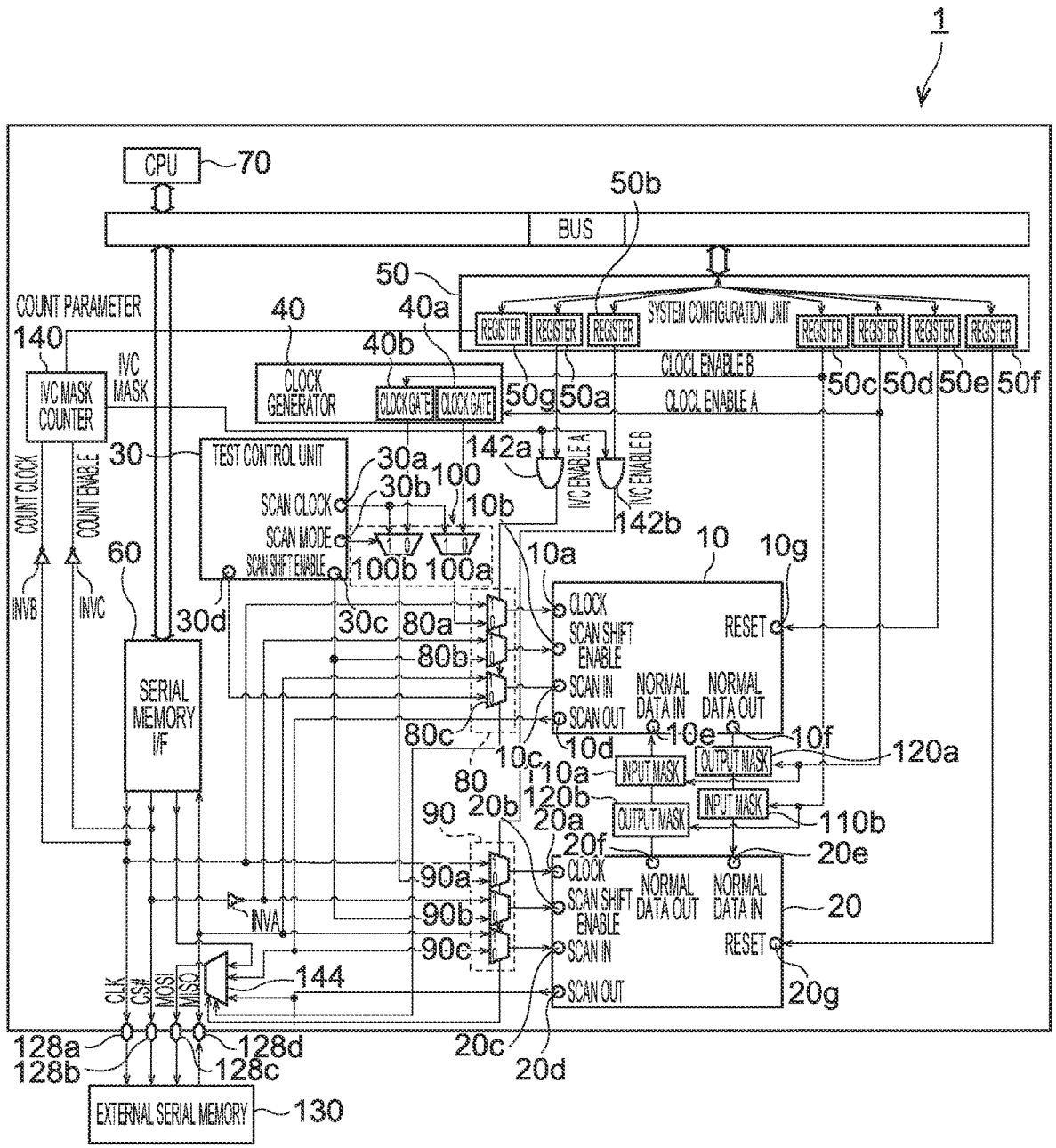
FIG. 14 is a block diagram illustrating a configuration of a semiconductor device according to a fourth embodiment.

FIG. 14 is a block diagram illustrating a configuration of the semiconductor device 1 according to the fourth embodiment. The semiconductor device 1 is a device that can store therein data set in the scan flip-flops 14 or 24, and further includes a register (register) 50g, an IVC mask counter (IVC Mask Counter) 140, AND gates 142A and 142B, a multiplexer 144, and inverters Invb and Invc.

The IVC mask counter 140 is connected to the register 50g, and is connected to the serial clock line CLK of the serial memory interface circuit 60 via the inverter Invb. Also, the IVC mask counter 140 is connected to the slave select line CS # via the inverter Invc, to the selection circuits 80*a* to 80*c* via the AND gate 142A, and to the selection circuits 90*a* to 90*c* via the AND gate 142B. Accordingly, to the IVC mask counter 140, a count parameter (Count parameter) signal is input from the register 50*g*, a count clock (Count clock) obtained by inverting the clock (CLK) is input from the serial clock line CLK, and a count enable (Count enable) signal obtained by inverting a slave selection signal is input from the slave select line CS #. The IVC mask counter 140 outputs an IVC mask (IVC mask) signal to the AND gates 142A and 142B.

The register 50*g* is connected to the IVC mask counter 140. The register 50*g* outputs the count parameter (Count parameter) signal to the IVC mask counter 140.

The IVC mask counter 140 starts a count-up operation when the count enable signal becomes 1. Accordingly, when the count number of the IVC mask counter 140 matches with the number input by the count parameter signal, for example, 200, the IVC mask counter 140 changes the IVC mask (IVC mask) signal from 0 to 1 and outputs it. Further, after the count value matches with the count parameter signal, the IVC mask counter 140 stops the count-up operation.

To the multiplexer 144, the master-out-slave-in line MOSI of the serial memory interface circuit 60, the scan-out terminal 10*d* of the first logical circuit 10, and the scan-out terminal 20*d* of the second logical circuit 20 are connected. Further, output lines of the AND gates 142A and 142B are connected to a determination terminal. The multiplexer 144 selects any of output data of the scan-out terminal 10*d*, output data of the scan-out terminal 20*d*, and the master-out-slave-in signal (MOSI) of the serial memory interface circuit 60 in accordance with output signals of the AND gates 142A and 142B, and outputs the selected one to the terminal 128*c*. The multiplexer 144 selects the output data of the scan-out terminal 10*d* when the output of the AND gate 142A is 1 and the output of the AND gate 142B is 0, selects the output data of the scan-out terminal 20*d* when the output of the AND gate 142A is 0 and the output of the AND gate 142B is 1, and selects the master-out-slave-in signal (MOSI) of the serial memory interface circuit 60 in other cases.

Figure 15:
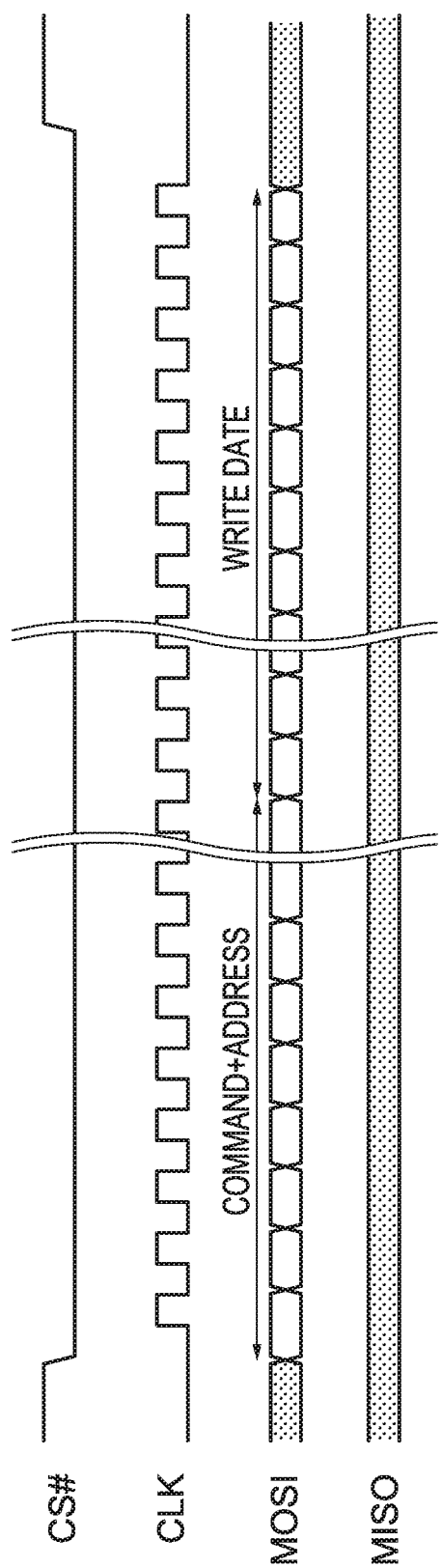
FIG. 15 is a timing chart of a data write operation of a serial memory interface circuit according to a fourth embodiment.
Figure 16:
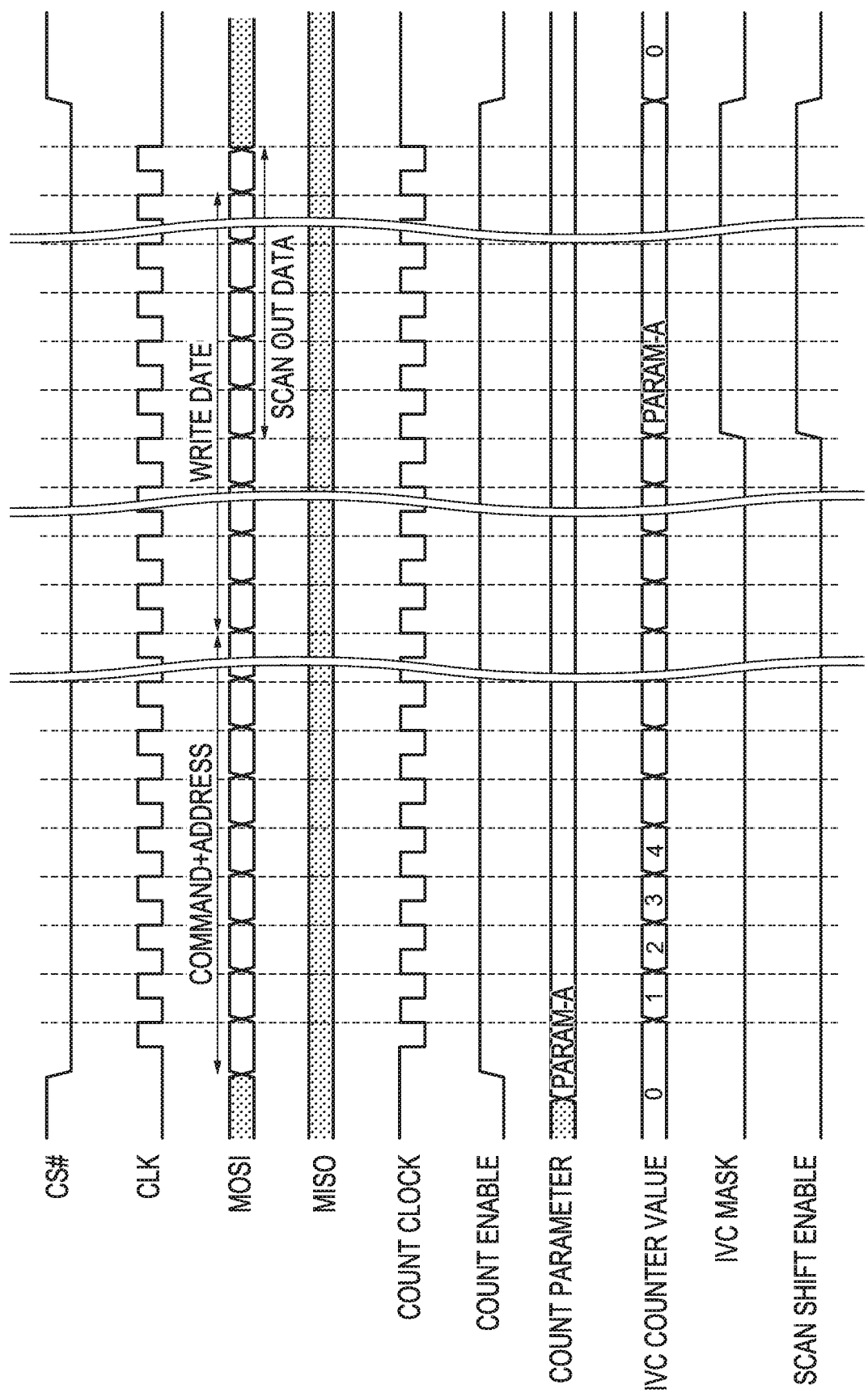
FIG. 16 is a timing chart of an operation of writing data in a scan chain according to the fourth embodiment.

An operation example is described here with reference to FIGS. 15 and 16, in which data set in the scan flip-flops 14 (FIG. 2A) is output to the storage device 130. In the present embodiment, there is described an example in which the data set in the scan flip-flops 14 (FIG. 2A) of the first logical circuit 10 is stored in the storage device 130 before a transition to a power-saving mode, and is set again at a transition to a normal mode.

FIG. 15 is a timing chart illustrating timings of signals that flow in respective signal lines in an operation of saving data set in the scan flip-flops 14 of the first logical circuit 10. The vertical axis represents, in sequence, a selection signal (CS #) that flows in the slave select line CS #, a clock (CLK) signal that flows in the serial clock line CLK, a master-out-slave-in (MOSI) signal that flows in the master-out-slave-in line MOSI, and a master-in-slave-out (MISO) signal that flows in the master-in-slave-out line MISO. The horizontal axis represents a time.

As illustrated in FIG. 15, generally, in a write operation to the storage device 130, a command (Command), an address (Address), and write data (Write Data) are output in sequence to the master-out-slave-in signal (MOSI).

Accordingly, data set in the scan flip-flops 14 is output from the scan-out terminal 10*d* via a scan chain in sequence. The output data is selected by the multiplexer 144 and is stored in the storage device 130. Thereafter, the operation mode transitions to a power-saving mode.

FIG. 16 is a timing chart illustrating signals that flow in respective signal lines and a control signal in an operation of saving data set in the scan flip-flops 14 of the first logical circuit 10. The vertical axis represents, in sequence, a selection signal (CS #), a clock (CLK) signal, a master-out-slave-in (MOSI) signal, a master-in-slave-out (MISO) signal, a count clock (Count clock) signal, a count enable (Count enable) signal, a count parameter (Count parameter) signal, an IVC counter value (IVC Counter Value), an IVC mask (IVC mask) signal, and a scan shift enable (Scan Shift Enable) signal.

Scan out data (Scan Out Data) represented in the master-out-slave-in signal (MOSI) corresponds to the length of a scan chain. That is, when the scan out data is connected to the scan chain, data set in the scan flip-flops 14 is output from the scan-out terminal 10*d*.

The count clock (Count clock) signal is a signal obtained by inverting the clock (CLK) signal by the inverter Invb. The IVC mask counter 140 operates in synchronization with the count clock (Count clock) signal.

The count enable (Count enable) signal is a signal obtained by inverting the selection signal (CS #) by the inverter Invc. The count enable (Count enable) signal is High when the selection signal (CS #) is Low.

The count parameter (Count parameter) is a signal output by the register 50*g*. The count parameter is set due to control executed by the central processing device 70 to correspond to the length of the scan out data. For example, by setting a value of the count parameter to a total bit length of a command and an address to the storage device 130, it is possible to read data having a length corresponding to data in the scan chain from the storage device 130 and to set it to the scan chain length.

Further, when the write data length is longer than the scan chain length, it is possible to write data into the scan chain to be aligned with back by setting the value of the count parameter to "command length+address length+(write data length−scan chain length)".

The IVC counter value (IVC Counter Value) is counted up by the IVC mask counter 140 at rising the count clock signal, when the count enable signal becomes ON (a value 1). Further, when the IVC counter value matches with the count parameter, the IVC mask counter 140 fixes the IVC counter value to the value of the count parameter and maintains the value until the count enable signal becomes OFF (a value 0). In this manner, the IVC mask counter 140 operates with the count clock signal, and counts up when the count enable signal becomes ON (a value 1). Further, the IVC mask counter 140 is initialized to 0 without a clock in an asynchronous manner, when the count enable signal becomes OFF (a value 0).

The IVC mask signal becomes ON (a value 1) when the IVC counter value matches with the count parameter, and is maintained until the count enable signal becomes OFF (a value 0). Accordingly, the IVC mask signal is output as a value 1 and is maintained until the count enable signal becomes OFF (a value 0).

While the IVC mask signal is 1, the IVC enable signal A is set as 1. Therefore, the scan shift enable (Scan Shift Enable) signal is ON (a value 1) and the count enable signal is OFF (a value 0). In this manner, when the count value of the IVC mask counter 140 matches with the IVC counter value, the IVC mask signal is 1. In other cases, the IVC mask signal is 0. Accordingly, a scan chain is configured in the first logical circuit 10, and scan out data is set in the scan chain in sequence.

The scan flip-flops 14 select data output from the scan-out terminal 10*d* and output the selected data to the storage device 130, while the IVC mask signal is 1 and the IVC enable signal A is a value 1, that is, the AND gate 142A outputs 1. In this manner, data in the scan chain is stored in the storage device 130.

As described above, generally, the unit of writing data to an external memory such as the storage device 130 is a power of 2. Therefore, by writing data for a scan chain in write data to be aligned with back, it is possible to return data written into the external memory once from the storage device 130 to the scan chain as in the first embodiment in the original scan flip-flips 14 without shifting values.

Figure 17:
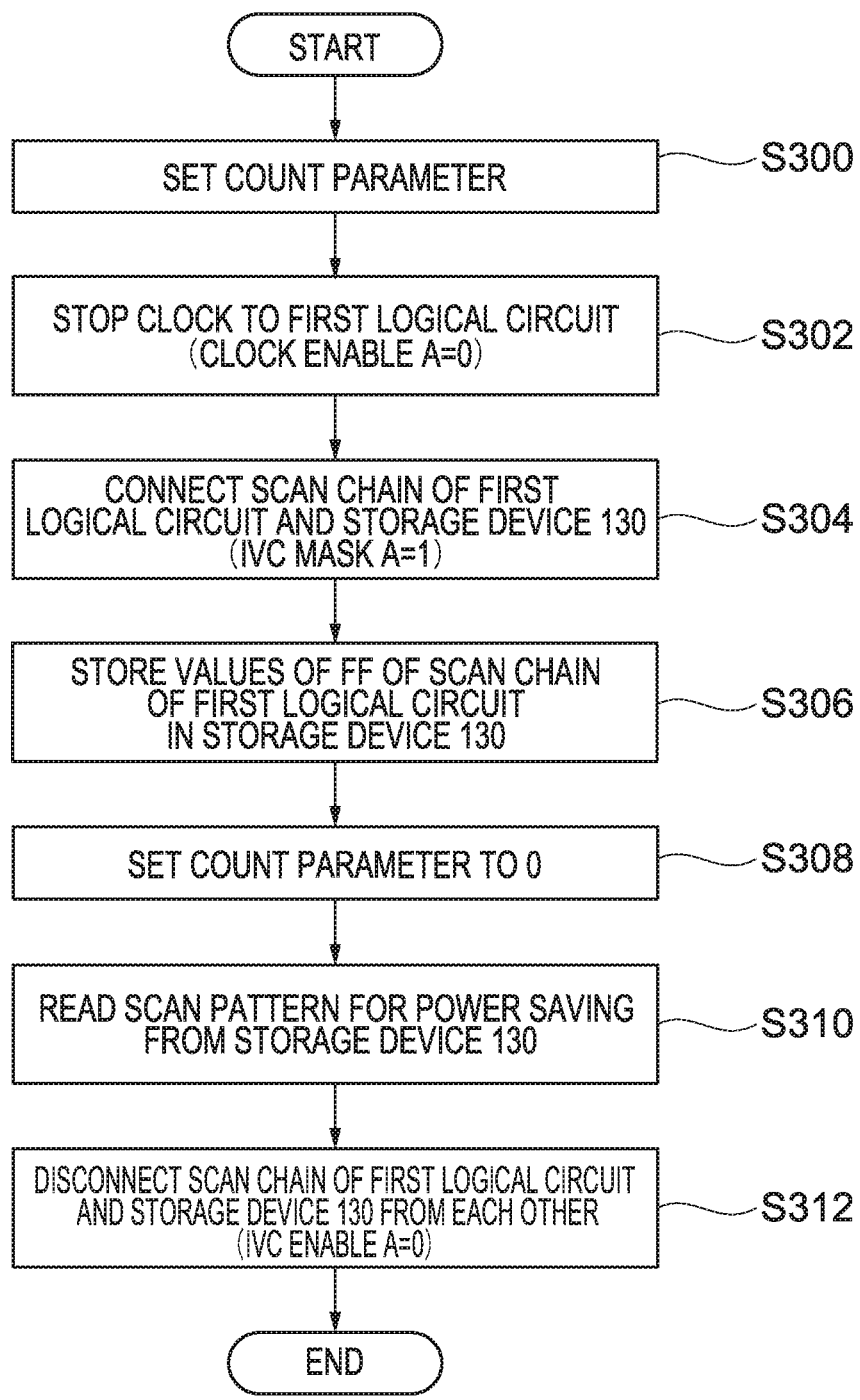
FIG. 17 is a flowchart for explaining an example of control for a transition to a power-saving mode according to the fourth embodiment.

Here, there is described a control example in which a state before a transition to a power-saving mode is retained and the transition to the power-saving mode is made. FIG. 17 is a flowchart for explaining an example of control for a transition to a power-saving mode. A case where the first logical circuit 10 transitions to the power-saving mode is described here.

First, the central processing device 70 calculates "command length+address length+(write data length−scan chain length)" and sets a count parameter in the register 50*g* (Step S300). Subsequently, the register 50*g* outputs the count parameter to the IVC mask counter 140. Also, the register 50*g* outputs the counter enable signal A that is set to 1 to the IVC mask counter 140.

Next, the register 50*d* sets the clock enable signal A to a value 0 in accordance with control executed by the central processing device 70 and outputs it to the clock gate 40*a* of the clock generation circuit 40. Accordingly, clock supply to the first logical circuit 10 is stopped (Step S302). Further, the register 50*a* sets a value of the IVC enable signal A to 1 in accordance with control executed by the central processing device 70 and outputs it to the AND gate 142A.

Next, the serial memory interface circuit 60 starts a write operation for the storage device 130 due to control executed by the central processing device 70. The IVC mask counter 140 counts a count clock and, when the counted value matches with a value of the count parameter, sets a value of an IVC mask signal to 1 and outputs it to the AND gate 142A. Accordingly, the selection circuits 80*a* to 80*c* each elect a corresponding signal line of the serial memory interface circuit 60. Subsequently, the master-out-slave-in line MOSI and the scan-out terminal 10*d* are connected to each other via the multiplexer 144, so that a scan chain in the first logical circuit 10 and the storage device 130 are connected to each other (Step S304).

Next, any write data stored in the storage device 130 is read sequentially and is set in the scan flip-flops 14 (FIG. 2A) that configure the scan chain. Accordingly, setting values set in the scan flip-flops 14 (FIG. 2A) immediately before a transition to a power-saving mode are stored in the storage device 130 (Step S306).

Next, when the write operation of the serial memory interface circuit 60 is completed, the selection signal (CS #) becomes 1 and the count enable signal becomes OFF (a value 0) in accordance therewith, so that the IVC mask counter value becomes 0.

Next, the register 50*g* sets the count parameter to 0 and outputs it to the IVC mask counter 140 in accordance with control executed by the central processing device 70. Accordingly, the IVC mask counter 140 sets the value of the IVC mask signal to 1 and continuously outputs it to the AND gate 142A. Subsequently, in accordance with control executed by the central processing device 70, a transition to a power-saving mode is made, and a scan pattern for power saving stored in the storage device 130 is set in the scan chain in the first logical circuit 10 (Step S310).

Next, the register 50*a* sets the value of the IVC enable signal to 0 in accordance with control executed by the central processing device 70 and outputs it to the AND gate 142A. Accordingly, the storage device 130 and the scan chain in the first logical circuit 10 are disconnected from each other (Step S312). In this manner, before the transition to the power-saving mode, write data included in an instruction signal of the central processing device 70 is set in the scan chain in the first logical circuit 10 in sequence. Accordingly, setting values set in the scan flip-flops 14 (FIG. 2A) immediately before the transition to the power-saving mode are stored in the storage device 130.

Figure 18:
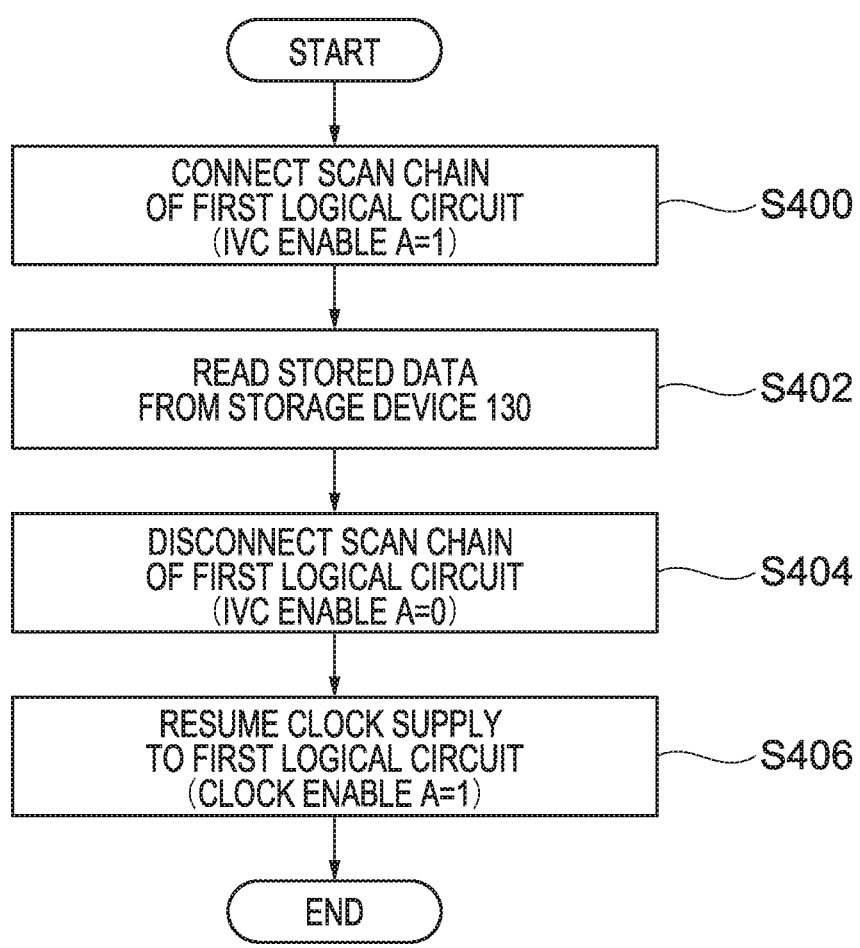
FIG. 18 is a flowchart for explaining an example of control for a transition to a normal mode according to the fourth embodiment.

Here, there is described a control example in which a state before a transition to a power-saving mode is reproduced and a transition to a normal mode is made. FIG. 18 is a flowchart for explaining an example of control for a transition to a normal mode. Here, there is described a case where the first logical circuit 10 is caused to transition to the normal mode.

First, the IVC enable signal A is set in an ON state (a value 1) due to control executed by the central processing device 70 (Step S400). Accordingly, the scan flip-flops 14 that is a scan chain in the first logical circuit 10 and the master-in-slave-out line MISO are connected to each other.

Next, due to control executed by the central processing device 70, setting values set in the scan flip-flops 14 (FIG. 2A) before a transition to a power-saving mode, which are stored in the storage device 130, are set in the scan chain in the first logical circuit 10 (Step S402). In this case, the central processing device 70 reads data corresponding to an address at which the setting values set in the scan flip-flops 14 (FIG. 2A) are stored. Accordingly, the data is set in the scan chain in the first logical circuit 10 via the master-in-slave-out line MISO.

Next, the IVC enable signal A is set in an OFF state (a value 0) due to control executed by the central processing device 70 (Step S404). Accordingly, the scan flip-flops 14 that is the scan chain in the first logical circuit 10 and the master-in-slave-out line MISO are disconnected from each other.

Next, the clock enable signal A is set in an ON state (1) due to control executed by the central processing device 70 (Step S406). Accordingly, clock supply from the clock generation circuit 40 to the first logical circuit 10 is resumed. Accordingly, setting values set in the scan flip-flops 14 (FIG. 2A) immediately before the transition to the power-saving mode are set again in the scan flip-flops 14 (FIG. 2A) and then a transition to a normal mode is made. Accordingly, it is possible to make the transition to the normal mode in the same state as that before the transition to the power-saving mode.

As described above, according to the present embodiment, it is possible to replace write data included in an output of the serial memory interface circuit 60 with values of the scan flip-flips 14 (FIG. 2A) that configure a scan chain in the first logical circuit 10 due to control executed by the central processing device 70 before a transition to a power-saving mode, only by adding the IVC mask counter 140, the register 50*g*, and a small number of logic elements. Accordingly, it is possible to store setting values set in the scan flip-flops 14 (FIG. 2A) immediately before the transition to the power-saving mode in the storage device 130. Therefore, it is possible to set data before the transition to the power-saving mode stored in the storage device 130 in the first logical circuit 10, so that processing can be resumed from a state before the transition to the power-saving mode.

According to at least one of the embodiments described above in detail, it is possible to suppress increase in the circuit scale and to reduce power consumption by setting a scan pattern for power saving in a scan pattern provided in a logical circuit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
 a central processing device;
 a first logical circuit having a first scan chain in which a first scan pattern is set, the first logical circuit being configured to suppress a leakage current when a first scan pattern for power saving is set in the first scan chain;
 a memory interface circuit configured to acquire the first scan pattern for power saving from an external storage device;
 an input mask circuit configured to maintain an input value to the first logical circuit to be a predetermined value when the first scan pattern for power saving is set in the first logical circuit; and
 an output mask circuit configured to maintain an output value from the first logical circuit to be a predetermined value when the first scan pattern for power saving is set in the first logical circuit,
 wherein the leakage current of the first logical circuit is suppressed by transferring the first scan pattern for power saving acquired by the memory interface circuit to the first logical circuit and setting the first scan pattern for power saving in the first scan chain under control of the central processing device.

2. The device of claim 1, wherein the leakage current of the first logical circuit is suppressed when the first logical circuit is in operation and a power-saving mode is unused.

3. The device of claim 1, further comprising:
 a test control circuit configured to set a first scan pattern for scan test in the first scan chain and to conduct a scan test on the first logical circuit; and
 a switch circuit configured to switch between a first path for inputting the first scan pattern for scan test to the first logical circuit and a second path for inputting the first scan pattern for power saving to the first logical circuit.

4. The device of claim 1, wherein the first scan chain is configured by a plurality of scan flip-flops, the first scan pattern for power saving is set in the scan flip-flops in a power-saving mode, and a first scan pattern for scan test is set in the scan flip-flops at a time of conducting a scan test.

5. The device of claim 4, further comprising:
 a clock generation circuit configured to supply a clock signal to the first logical circuit; and
 a system configuration circuit configured to stop supply of the clock signal from the clock generation circuit when the first scan pattern for power saving is set in the scan flip-flops.

6. The device of claim 5, wherein the system configuration circuit is configured to perform a resetting process of initializing the first logical circuit.

7. A control method of a semiconductor device including a central processing device, a first logical circuit having a first scan chain in which a scan pattern is set, the first logical circuit being configured to suppress a leakage current when a first scan pattern for power saving is set in the first scan chain, and a memory interface circuit configured to acquire the first scan pattern for power saving from an external storage device, the method comprising:
 suppressing the leakage current of the first logical circuit by transferring the first scan pattern for power saving acquired by the memory interface circuit to the first logical circuit and setting the first scan pattern for power saving in the first scan chain under control of the central processing device,
 input-masking of maintaining an input value to the first logical circuit to be a predetermined value when the first scan pattern for power saving is set in the first logical circuit; and
 output-masking of maintaining an output value from the first logical circuit to be a predetermined value when the first scan pattern for power saving is set in the first logical circuit.

8. The method of claim 7, wherein the leakage current of the first logical circuit is suppressed when the first logical circuit is in operation and a power-saving mode is unused.

9. The method of claim 7, further comprising:
 test-controlling of setting a first scan pattern for scan test in the first scan chain and conducting a scan test on the first logical circuit; and
 switching between a first path for inputting the first scan pattern for scan test to the first logical circuit and a second path for inputting the first scan pattern for power saving to the first logical circuit.

10. The method of claim 7, wherein:
 the semiconductor device further includes a second logical circuit having a second scan chain, the second logical circuit being configured to suppress a leakage current when a second scan pattern for power saving is set in the second scan chain, and
 the method further comprises:
 maintaining each of an input value to the first logical circuit and an output value from the second logical circuit to be a predetermined value when the first scan pattern for power saving is set in the first logical circuit; and
 maintaining each of an input value to the second logical circuit and an output value from the first logical circuit to be a predetermined value when the first scan pattern for power saving is set in the first logical circuit.

11. The method of claim 7, wherein:
 the first scan chain is configured by a plurality of scan flip-flops, and
 the method further comprises:
 setting the first scan pattern for power saving in the scan flip-flops in a power-saving mode; and
 setting a first scan pattern for scan test in the scan flip-flops at a time of conducting a scan test.

12. The method of claim 11, further comprising:
 clock-generating of supplying a clock signal to the first logical circuit; and stopping supply of the clock signal when the first scan pattern for power saving is set in the scan flip-flops.

13. The method of claim 12, wherein when a resetting process of initializing the first logical circuit is performed, supply of the clock signal is stopped.

14. A semiconductor device comprising:
a central processing device;
a first logical circuit having a first scan chain in which a scan pattern is set, the first logical circuit being configured to suppress a leakage current when a first scan pattern for power saving is set in the first scan chain;
a memory interface circuit configured to acquire the first scan pattern for power saving from an external storage device;
a second logical circuit having a second scan chain, the second logical circuit being configured to suppress a leakage current when a second scan pattern for power saving is set in the second scan chain;
a first mask circuit configured to maintain each of an input value to the first logical circuit and an output value from the second logical circuit to be a predetermined value when the first scan pattern for power saving is set in the first logical circuit; and
a second mask circuit configured to maintain each of an input value to the second logical circuit and an output value from the first logical circuit to be a predetermined value when the first scan pattern for power saving is set in the first logical circuit;
wherein the leakage current of the first logical circuit is suppressed by transferring the first scan pattern for power saving acquired by the memory interface circuit to the first logical circuit and setting the first scan pattern for power saving in the first scan chain under control of the central processing device.

* * * * *